US012113491B2

(12) United States Patent
Medra et al.

(10) Patent No.: US 12,113,491 B2
(45) Date of Patent: Oct. 8, 2024

(54) ACTIVE SPLITTING AMPLIFIER CIRCUIT

(71) Applicant: QUALCOMM Incorporated, San Diego, CA (US)

(72) Inventors: Alaaeldien Mohamed Abdelrazek Medra, San Diego, CA (US); Xingyi Hua, San Diego, CA (US); Naushad Dhamani, San Diego, CA (US); Francesco Gatta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 489 days.

(21) Appl. No.: 17/478,746

(22) Filed: Sep. 17, 2021

(65) Prior Publication Data

US 2022/0094310 A1 Mar. 24, 2022

Related U.S. Application Data

(60) Provisional application No. 63/082,176, filed on Sep. 23, 2020.

(51) Int. Cl.
*H03F 3/19* (2006.01)
*H04B 1/16* (2006.01)

(52) U.S. Cl.
CPC ............... *H03F 3/19* (2013.01); *H04B 1/16* (2013.01); *H03F 2200/451* (2013.01)

(58) Field of Classification Search
CPC ........ H03F 3/19; H03F 2200/451; H04B 1/16
USPC ............................................................ 330/311
See application file for complete search history.

(56) References Cited

U.S. PATENT DOCUMENTS

2014/0213209 A1* 7/2014 Holenstein .............. H03F 3/193
455/253.2

* cited by examiner

*Primary Examiner* — Hafizur Rahman
(74) *Attorney, Agent, or Firm* — Loza & Loza LLP

(57) ABSTRACT

Aspects of the present disclosure relate to a receiver including an amplifier circuit. The amplifier circuit includes a common-source amplifier having an input and an output, and a common-gate amplifier having an input and an output, wherein the input of the common-gate amplifier is coupled to the output of the common-source amplifier. The receiver also includes a first receive chain coupled to the output of the common-gate amplifier, and a second receive chain coupled to the output of the common-source amplifier.

25 Claims, 13 Drawing Sheets

ACTIVE SPLITTING AMPLIFIER CIRCUIT

RELATED APPLICATION

This application claims priority under 35 U.S.C. § 119(e) to U.S. Provisional Application No. 63/082,176 filed on Sep. 23, 2020, the entire specification of which is incorporated herein by reference.

BACKGROUND

Field

Aspects of the present disclosure relate generally to wireless communications, and more particularly, to amplifier circuits in receivers.

Background

A wireless device (e.g., smart phone) may transmit and receive radio frequency (RF) signals in one or more wireless networks (e.g., long-term evolution (LTE) network, fifth generation (5G) network, wireless local area network (WLAN), etc.). To receive RF signals, the wireless device includes one or more antennas and an amplifier circuit coupled to the one or more antennas. The amplifier circuit may include one or more amplifiers (e.g., low-noise amplifiers (LNAs)) configured to amplify RF signals received by the one or more antennas.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a receiver. The receiver includes an amplifier circuit. The amplifier circuit includes a common-source amplifier having an input and an output, and a common-gate amplifier having an input and an output, wherein the input of the common-gate amplifier is coupled to the output of the common-source amplifier. The receiver also includes a first receive chain coupled to the output of the common-gate amplifier, and a second receive chain coupled to the output of the common-source amplifier.

A second aspect relates to a receiver. The receiver includes an amplifier circuit. The amplifier circuit includes a common-source amplifier having an input and an output, and a common-gate amplifier having an input and an output, wherein the input of the common-gate amplifier is coupled to the output of the common-source amplifier. The receiver also includes a first switch circuit having a first input, a second input, and an output, wherein the first input of the first switch circuit is coupled to the output of the common-gate amplifier, and the second input of the first switch circuit is coupled to the output of the common-source amplifier. The receiver further includes a second switch circuit having a first input, a second input, and an output, wherein the first input of the second switch circuit is coupled to the output of the common-gate amplifier, and the second input of the second switch circuit is coupled to the output of the common-source amplifier.

A third aspect relates to a method for wireless communications. The method includes receiving multiple signals via an antenna, and passing the multiple signals through a first gain path, the first gain path including a common-source amplifier and a common-gate amplifier. The method also includes passing the multiple signals through a second gain path, the second gain path including the common-source amplifier and excluding the common-gate amplifier.

A fourth aspect relates to a receiver. The receiver includes an amplifier circuit. The amplifier circuit includes a first transistor having a source, a gate, and a drain, and a second transistor having a source, a gate, and a drain, wherein the source of the second transistor is coupled to the drain of the first transistor, and the gate of the second transistor is coupled to a bias circuit. The amplifier circuit also includes a third transistor having a source, a gate, and a drain, and a fourth transistor having a source, a gate, and a drain, wherein the source of the fourth transistor is coupled to the drain of the third transistor, and the gate of the fourth transistor is coupled to the bias circuit. The amplifier circuit further includes a load coupled to the drain of the second transistor and the drain of the fourth transistor. An input of the amplifier circuit is coupled to the gate of the first transistor and the gate of the third transistor, a first output of the amplifier circuit is coupled to the load, and a second output of the amplifier circuit is coupled between the drain of the first transistor and the source of the second transistor.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A wireless device (e.g., smart phone) may transmit and receive RF signals in one or more wireless networks (e.g., LTE network, 5G network, WLAN, etc.). To receive RF signals, the wireless device includes one or more antennas and an amplifier circuit coupled to the one or more antennas. The wireless device may be configured to receive multiple signals in different technologies. For example, the wireless device may be configured to receive various combinations of a 4G signal, a 5G signal, a WLAN signal, etc. The wireless device may also be configured to receive multiple signals with different amplitudes in the same technology (e.g., 5G) or different technologies. This may occur, for example, when the signals are transmitted from transmitters at different distances from the wireless device.

The multiple signals may be received at the wireless device via the same antenna instead of separate antennas. Using the same antenna to receive multiple signals advantageously reduces the cost and size of the wireless device by reducing the number of antennas on the wireless device. The reduction in the number of antennas also reduces routing complexity between the antennas and a receiver chip.

An antenna receiving multiple signals may be coupled to an amplifier circuit configured to amplify the multiple signals. In one approach, the amplifier circuit includes a common amplifier (e.g., a low-noise amplifier) for amplifying the multiple signals. A challenge with this approach is that the difference in the amplitudes of two signals may be large. In this case, the common amplifier may lack the dynamic range to properly amplify both signals.

In another approach, the amplifier circuit may include separate amplifiers (e.g., LNAs) for amplifying the multiple signals. In this approach, the input of the amplifier circuit is split between the amplifiers where each of the amplifiers is used to amplify a respective one of the signals. By using separate amplifiers (e.g., LNAs) to amplify the signals, this approach allows the gains for the signals to be independently controlled. An example of this approach is illustrated in FIG. 1 discussed below.

Figure 1:
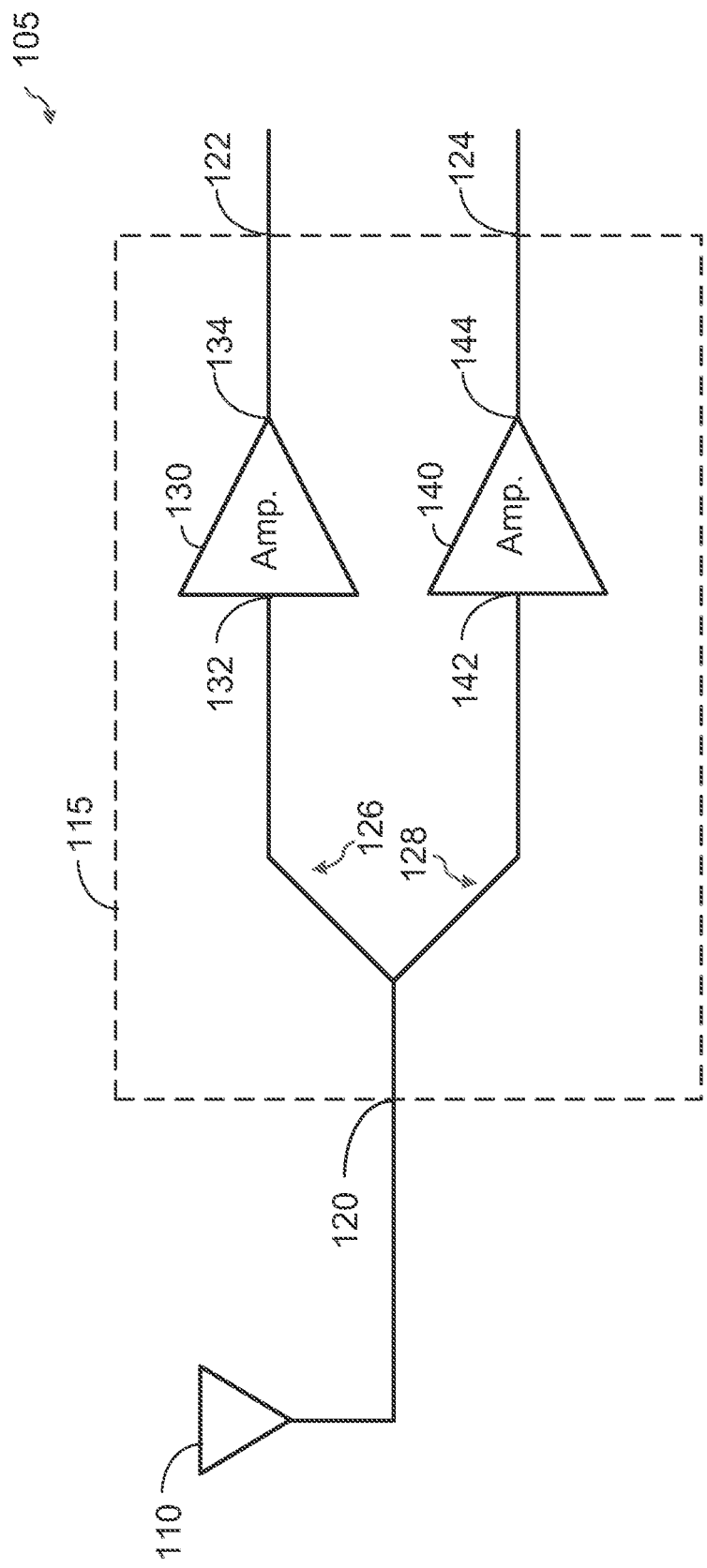
FIG. 1 shows an example of an amplifier circuit according to certain aspects of the present disclosure.

FIG. 1 shows an example of a wireless device 105 including an antenna 110 and an amplifier circuit 115. The amplifier circuit 115 has an input 120 coupled to the antenna 110, a first output 122, and a second output 124. The amplifier circuit 115 includes a first amplifier 130 and a second amplifier 140. The first amplifier 130 has an input 132 coupled to the input 120 of the amplifier circuit 115 and an output 134 coupled to the first output 122 of the amplifier circuit 115. The second amplifier 140 has an input 142 coupled to the input 120 of the amplifier circuit 115 and an output 144 coupled to the second output 124 of the amplifier circuit 115. The first output 122 may be coupled to a first receive chain (not shown) and the second output 124 may be coupled to a second receive chain (not shown) where each chain may include a frequency downconverter, a filter, etc. The wireless device 105 may also include one or more filters (not shown) between the antenna 110 and the amplifier circuit 115 in some implementations.

In this example, the input 120 of the amplifier circuit 115 is split into a first path 126 going to the first amplifier 130 and a second path 128 going to the second amplifier 140. The first amplifier 130 and the second amplifier 140 allow different signals received via the antenna 110 to be amplified with different gains, as discussed further below.

For the example where the antenna 110 receives two signals with different amplitudes, the gain of the first amplifier 130 may be higher than the gain of the second amplifier 140 to provide higher gain for the signal with the lower amplitude.

In cases where the difference in the amplitudes of the signals is large, the first amplifier 130 and the second amplifier 140 may operate at much different gains with different noise figure and linearity requirements. For example, the first amplifier 130 may have a high gain (e.g., 18 dB) with a low noise figure (NF) requirement (e.g., 0.9 dB) while the second amplifier 140 may have a low gain (e.g., −14 dB) with a high linearity requirement (e.g., Ip3 of 7 dBm). In this example, it may be very difficult to achieve both a low NF for the first amplifier 130 and high linearity for the second amplifier 140. This is because the load at the input 142 of the second amplifier 140 loads the input 132 of the first amplifier 130, which degrades the NF of the first amplifier 130.

Figure 2:
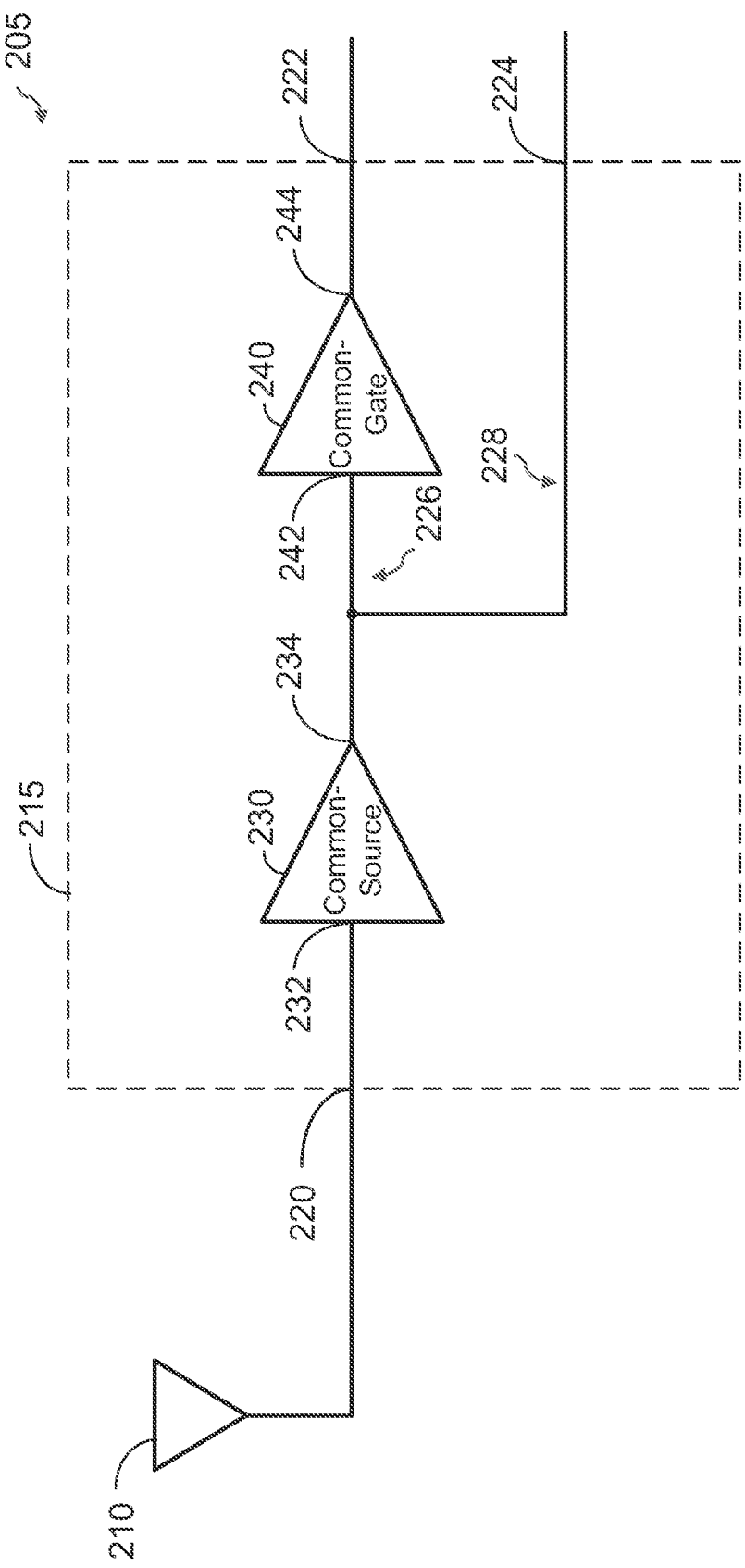
FIG. 2 shows an example of an amplifier circuit including a common-source amplifier and a common-gate amplifier according to certain aspects of the present disclosure.

FIG. 2 shows an example of a wireless device 205 including an antenna 210 and an exemplary amplifier circuit 215 according to aspects of the present disclosure. The amplifier circuit 215 has an input 220 coupled to the antenna 210, a first output 222, and a second output 224. The exemplary amplifier circuit 215 includes a common-source amplifier 230 and a common-gate amplifier 240. The common-source amplifier 230 has an input 232 coupled to the input 220 of the amplifier circuit 215 and an output 234 coupled to the second output 224 of the amplifier circuit 215. The common-gate amplifier 240 has an input 242 coupled to the output 234 of the common-source amplifier 230 and an output 244 coupled to the first output 222 of the amplifier circuit 215. The first output 222 may be coupled to a first receive chain (not shown in FIG. 2) and the second output 224 may be coupled to a second receive chain (not shown in FIG. 2) where each chain may include a frequency downconverter, a filter, etc. Examples of the first receive chain and the second receive chain are discussed below with reference to FIG. 10.

The amplifier circuit 215 has a first path 226 that runs from the input 220 of the amplifier circuit 215 to the first output 222 of the amplifier circuit 215, and a second path 228 that runs from the input 220 of the amplifier circuit 215 to the second output 224 of the amplifier circuit 215. In this example, both the common-source amplifier 230 and the common-gate amplifier 240 are in the first path 226, and the common-source amplifier 230 is in the second path 228. Thus, in this example, the common-source amplifier 230 is common to both the first path 226 and the second path 228. As discussed further below, the first path 226 provides higher gain than the second path 228. Thus, the first path 226 may be considered a high-gain path with respect to the second path 228, and the second path 228 may be considered a low-gain path with respect to the first path 226.

In this example, the common-source amplifier 230 provides low gain at the output 234. This is because the input 242 of the common-gate amplifier 240 provides a low impedance at the output 234 of the common-source amplifier 230, resulting in a small voltage swing at the output 234 of the common-source amplifier 230 and hence low gain. The common-gate amplifier 240 provides high gain at the output 244. This is because the impedance at the output 244 of the common-gate amplifier 240 is high, resulting in a large voltage swing at the output 244 of the common-gate amplifier 240 and hence high gain. Thus, the amplifier circuit 215 is capable of providing both low gain and high gain for amplifying signals with different amplitudes received via the antenna 210.

The amplifier circuit 215 is also capable of providing high gain with a low NF and low gain with high linearity. This is because the linearity of the common-source amplifier 230 is dominated by the transconductance of the common-source amplifier 230 due to the small voltage swing at the output 234. As a result, the linearity of the common-source amplifier 230 may be increased by increasing the bias current of the common-source amplifier 230 to provide low gain with high linearity.

In addition, since the common-source amplifier 230 is in both the first path 226 and the second path 228 of the amplifier circuit 215, the amplifier circuit 215 does not suffer from the input loading issue that degrades the NF of the first amplifier 130 in the amplifier circuit 115 discussed above. This makes it easier for the amplifier circuit 215 to achieve both high gain with a low NF and low gain with high linearity.

Further the bias current in the common-source amplifier 230 also flows in the common-gate amplifier 240 since the output 234 of the common-source amplifier 230 is coupled to the input 242 of the common-gate amplifier 240. As a result, increasing the bias current in the common-source amplifier 230 to increase linearity at the output 234 of the common-source amplifier 230 also improves the NF and linearity for the high-gain path (i.e., the first path 226). Thus, the bias current may be increased to improve both the linearity at the second output 224 and the NF as well as the linearity for the high-gain path.

Figure 3:
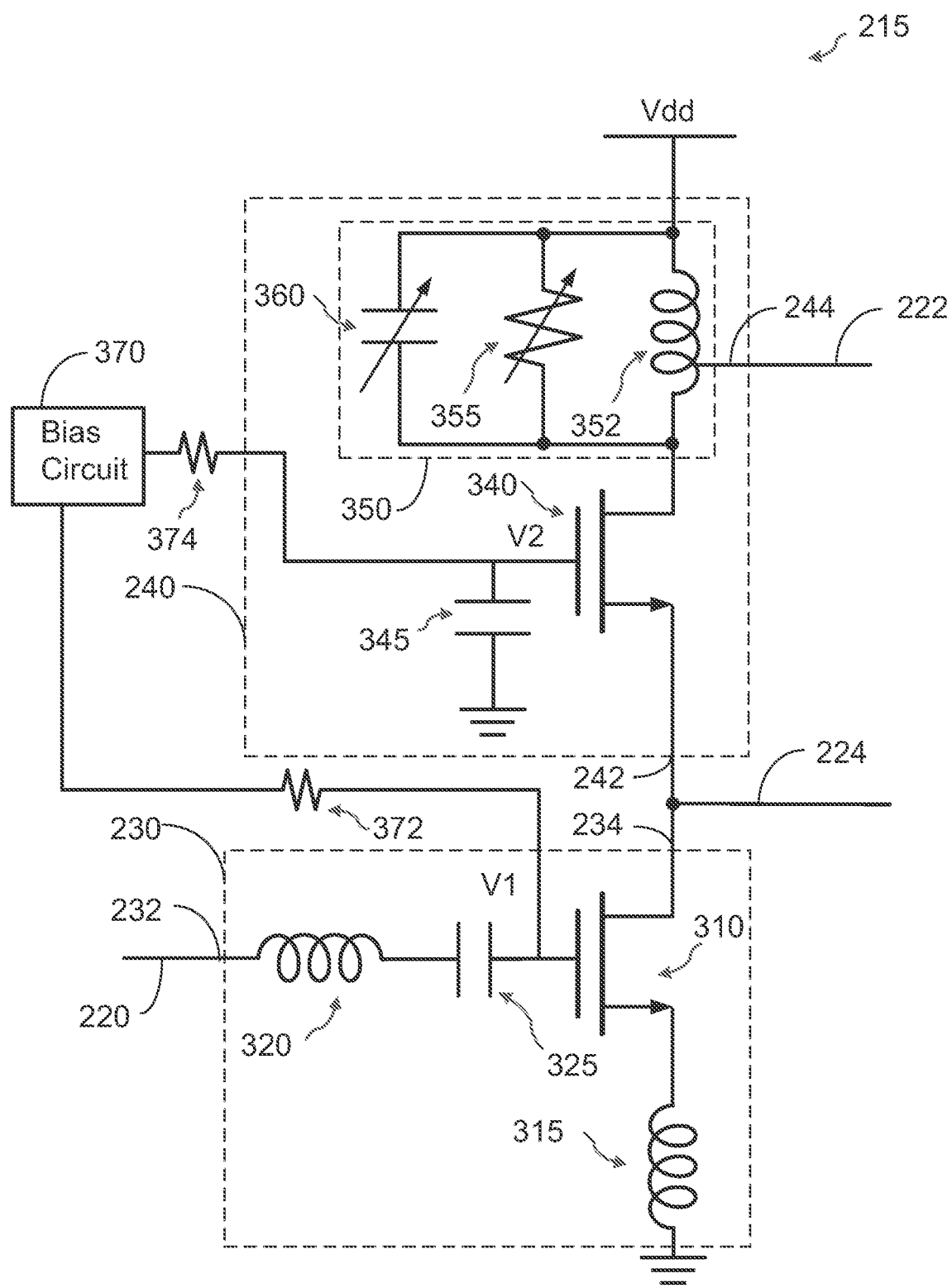
FIG. 3 shows an exemplary implementation of the common-source amplifier and the common-gate amplifier according to certain aspects of the present disclosure.

FIG. 3 shows an exemplary implementation of the common-source amplifier 230 and the common-gate amplifier 240 according to certain aspects. The common-source amplifier 230 includes a first transistor 310 (e.g., n-type field effect transistor (NFET)), a source-degeneration inductor 315, a gate inductor 320, and a first coupling capacitor 325. In this example, the gate inductor 320 and the first coupling capacitor 325 are coupled in series between the input 232 and the gate of the first transistor 310. The source-degeneration inductor 315 is coupled between the source of the first transistor 310 and ground to provide source degeneration. The output 234 of the common-source amplifier 230 is taken at the drain of the first transistor 310. The gate of the first transistor 310 is DC biased by bias voltage V1, as shown in FIG. 3. Although the first transistor 310 is implemented with an NFET in the example shown in FIG. 3, it is to be appreciated that the first transistor 310 may be implemented with another type of transistor (e.g., p-type field effect transistor (PFET)).

In this example, the linearity of the common-source amplifier 230 may be dominated by the transconductance (i.e., gm1) of the first transistor 310 due to the small voltage swing at the output 234. As a result, the linearity of the common-source amplifier 230 may be increased by increasing the bias current of the common-source amplifier 230. The linearity of the common-source amplifier 230 may be further increased by increasing the inductance of the source-degeneration inductor 315. Thus, the output 234 may achieve a high linearity by increasing the bias current and/or increasing the inductance of the source-degeneration inductor 315.

The gate inductor 320 is used to provide impedance matching at the input 220. The first coupling capacitor 325 is configured to AC couple signals received at the input 232 to the gate of the first transistor 310. The first coupling capacitor 325 is also configured to block the bias voltage V1 from the input 232.

The common-gate amplifier 240 includes a second transistor 340 (e.g., NFET), a load 350, and a second coupling capacitor 345. In this example, the input 242 of the common-gate amplifier 240 is located at the source of the second transistor 340. The gate of the second transistor 340 is DC biased by the bias voltage V2. The second coupling capacitor 345 is coupled between the gate of the second transistor 340 and ground. The second coupling capacitor 345 is configured to AC couple the gate of the second transistor 340 to ground. The load 350 is coupled between a voltage supply rail Vdd and the drain of the second transistor 340. Although the second transistor 340 is implemented with an NFET in the example shown in FIG. 3, it is to be appreciated that the second transistor 340 may be implemented with another type of transistor (e.g., PFET).

In this example, the impedance looking into the source of the second transistor 340 is low (e.g., approximately equal to 1/gm2 where gm2 is the transconductance of the second transistor 340). As a result, the common-gate amplifier 240 has a low input impedance. Because the input 242 of the common-gate amplifier 240 is coupled to the output 234 of the common-source amplifier 230, the low input impedance of the common-gate amplifier 240 causes the voltage swing at the output 234 of the common-source amplifier 230 to be small, resulting in the low gain of the common-source amplifier 230 discussed above. Because of the small voltage swing at the output 234, the linearity at the output 234 is dominated by the transconductance (i.e., gm1) of the first transistor 310. As a result, the linearity at the output 234 (i.e., low-gain path) may be increased by increasing the bias current of the first transistor 310. Because of the small voltage swing at the output 234, non-linearity due to the large voltage swing at the drain of the second transistor 340 has little to no effect on the common-source amplifier 230, which helps the common-source amplifier 230 achieve high linearity.

In this example, the second transistor 340 and the first transistor 310 are coupled in a cascode configuration, which provides a high impedance at the drain of the second transistor 340. The high impedance results in the large voltage swing at the drain of the second transistor 340 and the high gain at the output 244.

In the example in FIG. 3, the load 350 coupled to the drain of the second transistor 340 includes a load inductor 352, a variable resistor 355, and a variable capacitor 360. In this example, the load inductor 352, the variable resistor 355, and the variable capacitor 360 are coupled in parallel, and the output 244 of the common-gate amplifier 240 is coupled to the load inductor 352. However, it is to be appreciated that the load 350 is not limited to the exemplary implementation shown in FIG. 3. In one example, the gain of the output 244 may be adjusted by adjusting the resistance of the variable resistor 355, and the center frequency of the common-gate amplifier 240 may be adjusted by adjusting the capacitance of the variable capacitor 360. In this example, the first output 222 of the amplifier circuit 215 is coupled to the load 350, and, more particularly, to the load inductor 352. However, it is to be appreciated that the present disclosure is not limited to this example.

As discussed above, because the linearity at the output 234 is dominated by the transconductance (i.e., gm1) of the first transistor 310, the linearity at the output 234 may be increased by increasing the bias current of the first transistor 310. The bias current of the first transistor 310 also flows in the second transistor 340. Thus, increasing the bias current of the first transistor 310 to improve linearity at the second output 224 also improves the NF for the high-gain path. The bias current may be adjusted, for example, by adjusting the bias voltage V1 and/or the bias voltage V2.

In the example in FIG. 3, the bias voltages V1 and V2 are generated by a bias circuit 370 coupled to the gate of the first transistor 310 and the gate of the second transistor 340. The bias circuit 370 may be implemented with one or more current mirrors, one or more voltage dividers, or another type of voltage bias circuit. In certain aspects, the gate of the first transistor 310 may be coupled to the bias circuit 370 via a first resistor 372 and the gate of the second transistor 340 may be coupled to the bias circuit 370 via a second resistor 374.

Figure 4:
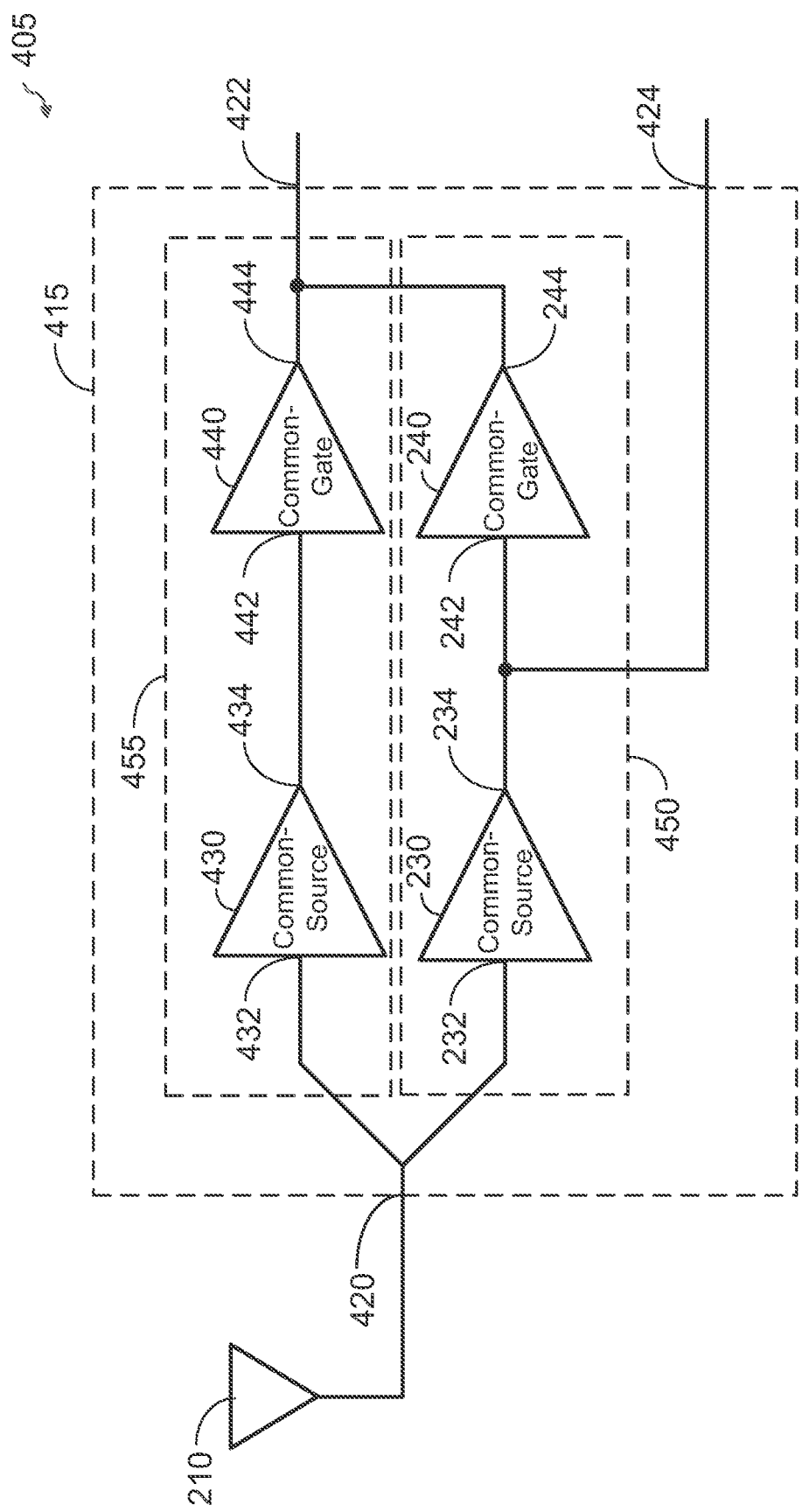
FIG. 4 shows an example of an amplifier circuit including two branches according to certain aspects of the present disclosure.

FIG. 4 shows another example of an amplifier circuit 415 in a wireless device 405 according to aspects of the present disclosure. The amplifier circuit 415 has an input 420 coupled to the antenna 210, a first output 422, and a second output 424. The first output 422 may be coupled to a first receive chain (not shown in FIG. 4) and the second output 424 may be coupled to a second receive chain (not shown in FIG. 4) where each chain may include a frequency downconverter, a filter, etc. Examples of the first receive chain and the second receive chain are discussed below with reference to FIG. 10.

In this example, the amplifier circuit 415 includes a first branch 450 and a second branch 455. The first branch 450 includes the common-source amplifier 230 and the common-gate amplifier 240 discussed above. The second branch 455 includes a second common-source amplifier 430 and a second common-gate amplifier 440. In the discussion below, the common-source amplifier 230 and the common-gate amplifier 240 are referred to as the first common-source amplifier 230 and the first common-gate amplifier 240, respectively.

In the first branch 450, the input 232 of the first common-source amplifier 230 is coupled to the input 420 of the amplifier circuit 415 and the output 234 of the first common-source amplifier 230 is coupled to the second output 424 of the amplifier circuit 415. The input 242 of the first common-gate amplifier 240 is coupled to the output 234 of the first common-source amplifier 230 and the output 244 of the first common-gate amplifier 240 is coupled to the first output 422 of the amplifier circuit 215.

In the second branch 455, the second common-source amplifier 430 has an input 432 coupled to the input 420 of the amplifier circuit 415 and an output 434. The second common-gate amplifier 440 has an input 442 coupled to the output 434 of the second common-source amplifier 430 and an output 444 coupled to the first output 422 of the amplifier circuit 415. As shown in FIG. 4, the second branch 455 is coupled in parallel with the first branch 450 between the input 420 of the amplifier circuit 415 and the first output 422 of the amplifier circuit 415. The output 244 of the first common-gate amplifier 240 and the output 444 of the second common-gate amplifier 440 are combined at the first output 422 of the amplifier circuit 415, which increases the gain at the first output 422 of the amplifier circuit 415.

Figure 5:
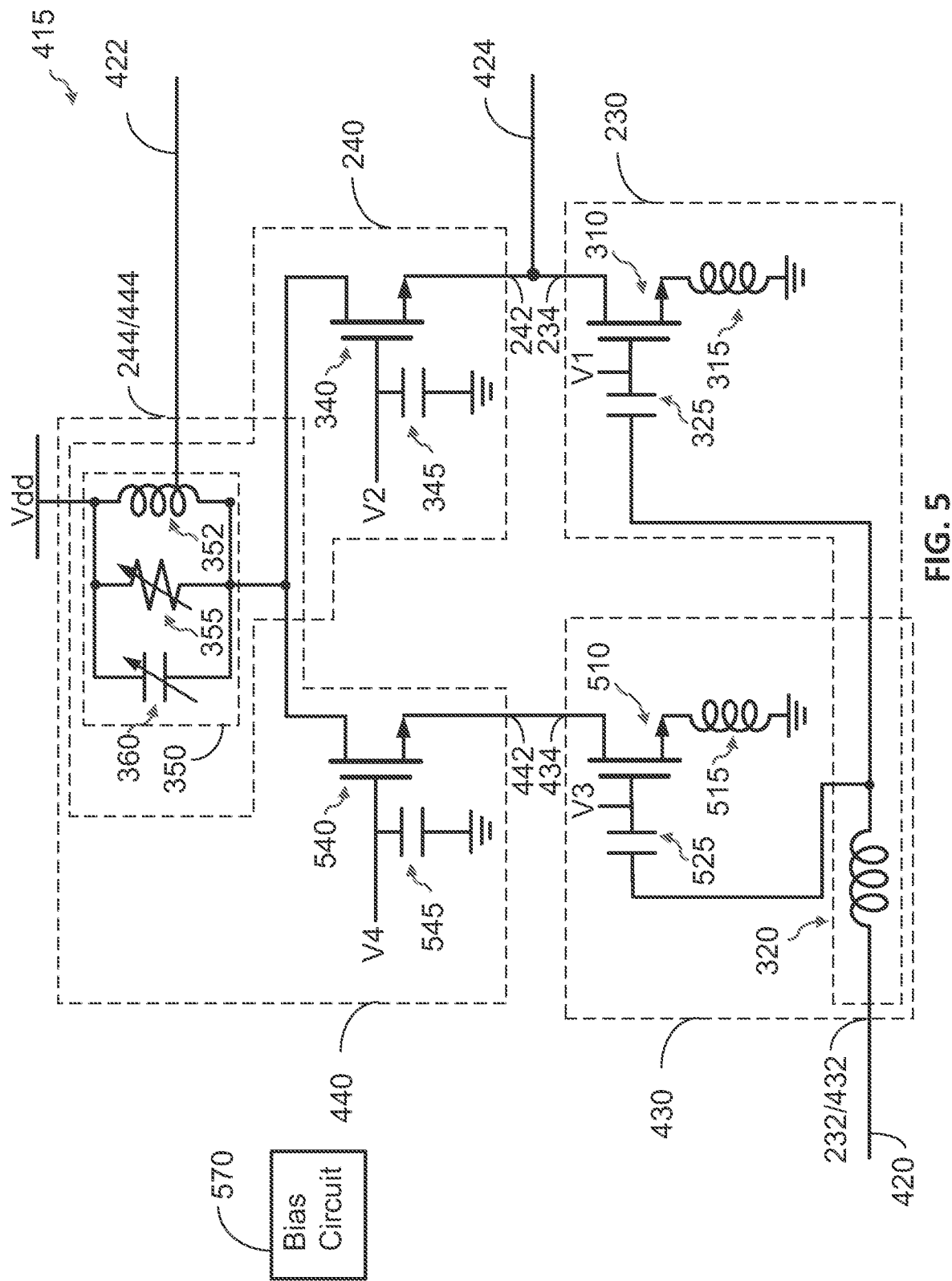
FIG. 5 shows an exemplary implementation of common-source amplifiers and common-gate amplifiers in the branches according to certain aspects of the present disclosure.

FIG. 5 shows an exemplary implementation of the amplifier circuit 415 according to certain aspects. In this example, the first common-source amplifier 230 and the first common-gate amplifier 240 are implemented with the exemplary implementation shown in FIG. 3. Because the exemplary implementation of the first common-source amplifier 230 and the first common-gate amplifier 240 is discussed above with reference to FIG. 3, a description of the exemplary implementation is not repeated here for brevity.

In this example, the second common-source amplifier 430 includes a third transistor 510 (e.g., NFET), a second source-degeneration inductor 515, and a third coupling capacitor 525. In this example, the source-degeneration inductor 315 in the first common-source amplifier 230 may be referred to as the first source-degeneration inductor 315. In this example, the second common-source amplifier 430 shares the gate inductor 320 with the first common-source amplifier 230. The gate inductor 320 and the third coupling capacitor 525 are coupled in series between the input 432 and the gate of the third transistor 510. The gate inductor 320 is used to provide impedance matching at the input 420 of the amplifier circuit 415, and the third coupling capacitor 525 is used to AC couple the input 432 to the gate of the third transistor 510.

The second source-degeneration inductor 515 is coupled between the source of the third transistor 510 and ground to provide source degeneration. The output 434 of the second common-source amplifier 430 is taken at the drain of the third transistor 510. The gate of the third transistor 510 is DC biased by bias voltage V3. The bias voltage V3 may be the same as the bias voltage V1 or may be different from the bias voltage V1. Although the third transistor 510 is implemented with an NFET in the example shown in FIG. 5, it is to be appreciated that the third transistor 510 may be implemented with another type of transistor (e.g., PFET).

The second common-gate amplifier 440 includes a fourth transistor 540 (e.g., NFET), and a fourth coupling capacitor 545. The second common-gate amplifier 440 shares the load 350 with the first common-gate amplifier 240. In this example, the input 442 of the second common-gate amplifier 440 is located at the source of the fourth transistor 540. The gate of the fourth transistor 540 is DC biased by the bias voltage V4, which may be the same as or different from the bias voltage V2. The fourth coupling capacitor 545 is coupled between the gate of the fourth transistor 540 and ground. The fourth coupling capacitor 545 is configured to AC couple the gate of the fourth transistor 540 to ground. The load 350 is coupled between the voltage supply rail Vdd and the drain of the fourth transistor 540. Although the fourth transistor 540 is implemented with an NFET in the example shown in FIG. 5, it is to be appreciated that the fourth transistor 540 may be implemented with another type of transistor (e.g., PFET).

In this example, the first source-degeneration inductor 315 and the second source-degeneration inductor 515 are in parallel since the first branch 450 and the second branch 455 are coupled in parallel. Because the first source-degeneration inductor 315 and the second source-degeneration inductor 515 are in parallel, the degeneration inductance of the amplifier circuit 415 is lower than the inductance of each of the first source-degeneration inductor 315 and the second source-degeneration inductor 515 taken individually. This allows the degeneration inductance of the amplifier circuit 415 to be lowered to increase the gain at the first output 422 of the amplifier circuit 415 without having to decrease the inductance of the first source-degeneration inductor 315, which would decrease linearity at the second output 424. Without the second source-degeneration inductor 515 in the second branch 455, lowering the degeneration inductance of the amplifier circuit 415 to increase the gain at the first output 422 would require decreasing the inductance of the source-degeneration inductor 315, which would decrease linearity at the second output 424.

In the example in FIG. 5, the bias voltages V1, V2, V3 and V4 are generated by a bias circuit 570 coupled to the gate of the first transistor 310, the gate of the second transistor 340, the gate of the third transistor 510, and the gate of the fourth transistor 540. For ease of illustration, the individual connections between the bias circuit 570 and the gates of the first transistor 310, the second transistor 340, the third transistor 510, and the fourth transistor 540 are not explicitly shown in FIG. 5. The bias circuit 570 may be implemented with one or more current mirrors, one or more voltage dividers, or another type of voltage bias circuit. It is to be appreciated that the gate of each of the first transistor 310, the second transistor 340, the third transistor 510, and the fourth transistor 540 may be coupled to the bias circuit 570 via a respective resistor (not shown).

Figure 6:
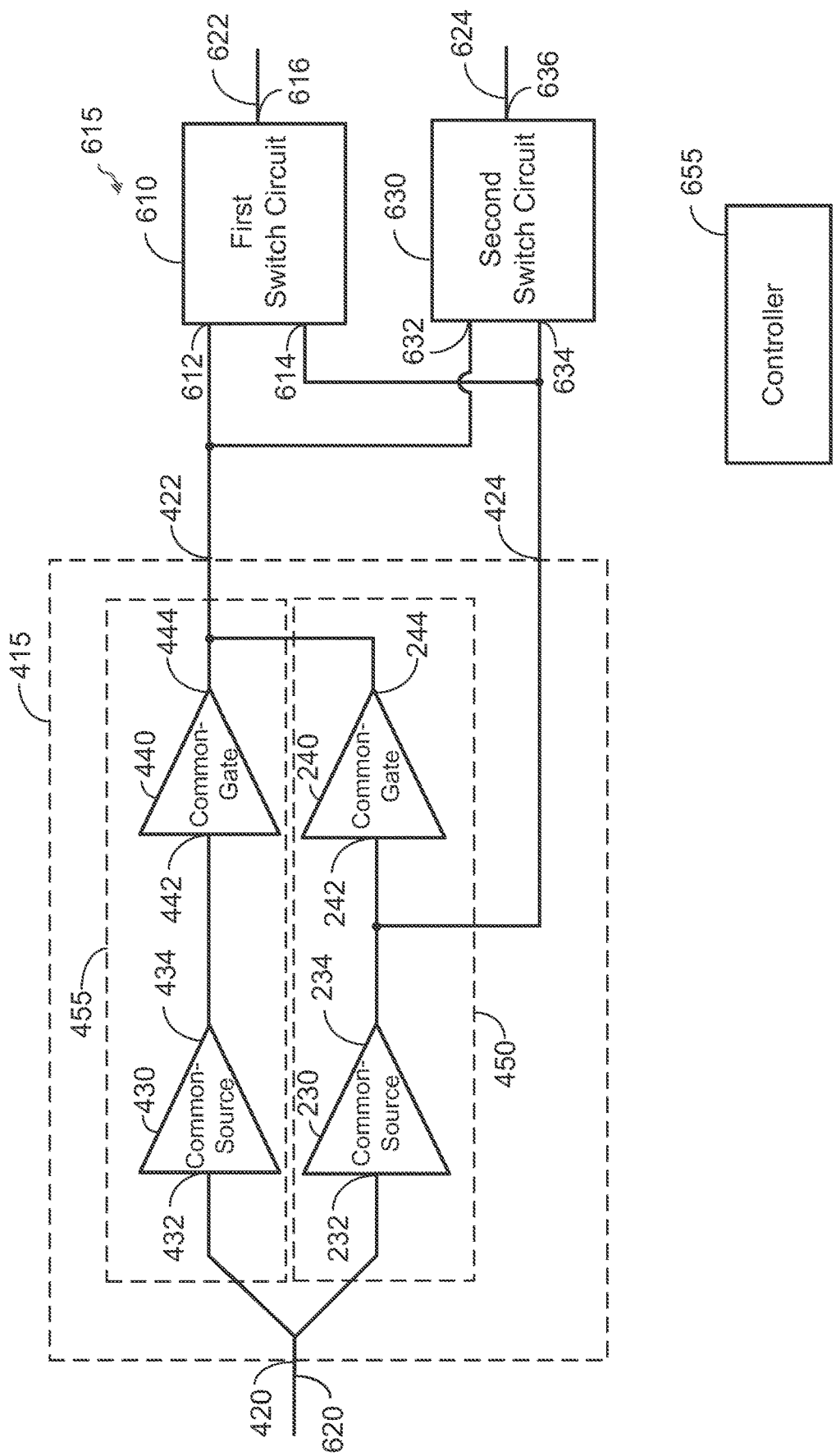
FIG. 6 shows an example of an amplifier circuit including switch circuits according to certain aspects of the present disclosure.

FIG. 6 shows another example of an amplifier circuit 615 according to certain aspects of the present disclosure. The amplifier circuit 615 has an input 620 coupled to the antenna 210 (not shown in FIG. 6), a first output 622, and a second output 624. The first output 622 may be coupled to a first receive chain (not shown in FIG. 6) and the second output 624 may be coupled to a second receive chain (not shown in FIG. 6) where each receive chain may include a frequency downconverter, a filter, etc.

In this example, the amplifier circuit 615 includes the exemplary amplifier circuit 415 in FIG. 4. The amplifier circuit 415 may be implemented with the exemplary implementation shown in FIG. 5, although it is to be appreciated that the amplifier circuit 415 is not limited to this implementation. In this example, the input 420 of the amplifier circuit 415 is coupled to the input 620.

The amplifier circuit 615 also includes a first switch circuit 610 and a second switch circuit 630. The first switch circuit 610 has a first input 612 coupled to the first output 422 of the amplifier circuit 415, a second input 614 coupled to the second output 424 of the amplifier circuit 415, and an output 616. The first switch circuit 610 is configured to selectively couple the first input 612 or the second input 614 to the output 616 under the control of a controller 655. The output 616 of the first switch circuit 610 is coupled to the first output 622 of the amplifier circuit 615. Thus, the first switch circuit 610 allows the controller 655 to couple the first output 422 or the second output 424 of the amplifier circuit 415 to the first output 622 of the amplifier circuit 615.

The second switch circuit 630 has a first input 632 coupled to the first output 422 of the amplifier circuit 415, a second input 634 coupled to the second output 424 of the amplifier circuit 415, and an output 636. The second switch circuit 630 is configured to selectively couple the first input 632 or the second input 634 to the output 636 under the control of the controller 655. The output 636 of the second switch circuit 630 is coupled to the second output 624 of the amplifier circuit 615. Thus, the second switch circuit 630 allows the controller 655 to couple the first output 422 or the second output 424 of the amplifier circuit 415 to the second output 624 of the amplifier circuit 615.

Note that the individual connections between the controller 655 and each of the first switch circuit 610 and second switch circuit 630 are not explicitly shown in FIG. 6 for ease of illustration.

In certain aspects, the first output 622 of the amplifier circuit 615 is coupled to a first receive chain (not shown in FIG. 6) configured to process a first signal and the second output 624 of the amplifier circuit 615 is coupled to a second receive chain (not shown in FIG. 6) configured to process a second signal. The first signal and the second signal are received via the antenna 210 and are amplified by the amplifier circuit 415 before going to the first receive chain and the second receive chain. The first signal and the second signal may be in different technologies or in the same technology. For example, the first signal may be a WLAN signal, a 4G signal, or a 5G signal, and the second signal may be a WLAN signal, a 4G signal, or a 5G signal.

In these aspects, the controller 655 uses the first switch circuit 610 and the second switch circuit 630 to control whether the high-gain path or the low-gain path of the amplifier circuit 415 is used for each signal. For example, in a first switch mode, the controller 655 directs the first switch circuit 610 to select the first input 612 of the first switch circuit 610 and directs the second switch circuit 630 to select the second input 634 of the second switch circuit 630. This causes the first switch circuit 610 to couple the first output 422 of the amplifier circuit 415 (which is in the high-gain path) to the first output 622 of the amplifier circuit 615 (which is coupled to the first receive chain), and the second switch circuit 630 to couple the second output 424 of the amplifier circuit 415 (which is in the low-gain path) to the second output 624 of the amplifier circuit 615 (which is coupled to the second receive chain). Thus, in the first switch mode, the high-gain path is used for the first signal and the low-gain path is used for the second signal.

In a second switch mode, the controller 655 directs the first switch circuit 610 to select the second input 614 of the first switch circuit 610 and directs the second switch circuit 630 to select the first input 632 of the second switch circuit 630. This causes the first switch circuit 610 to couple the second output 424 of the amplifier circuit 415 (which is in the low-gain path) to the first output 622 of the amplifier circuit 615 (which is coupled to the first receive chain), and the second switch circuit 630 to couple the first output 422 of the amplifier circuit 415 (which is in the high-gain path) to the second output 624 of the amplifier circuit 615 (which is coupled to the second receive chain). Thus, in the second switch mode, the high-gain path is used for the second signal and the low-gain path is used for the first signal.

It is to be appreciated that the amplifier circuit 615 is not limited to the amplifier circuit 415. For example, in some implementations, the amplifier circuit 615 may include the exemplary amplifier circuit 215 instead of the amplifier circuit 415. In these implementations, the input 220 of the amplifier circuit 215 may be coupled to the input 620 of the amplifier circuit 615, the first output 222 of the amplifier circuit 215 may be coupled to the first input 612 of the first switch circuit 610 and the first input 632 of the second switch circuit 630, and the second output 224 of the amplifier circuit 215 may be coupled to the second input 614 of the first switch circuit 610 and the second input 634 of the second switch circuit 630.

Figure 7:
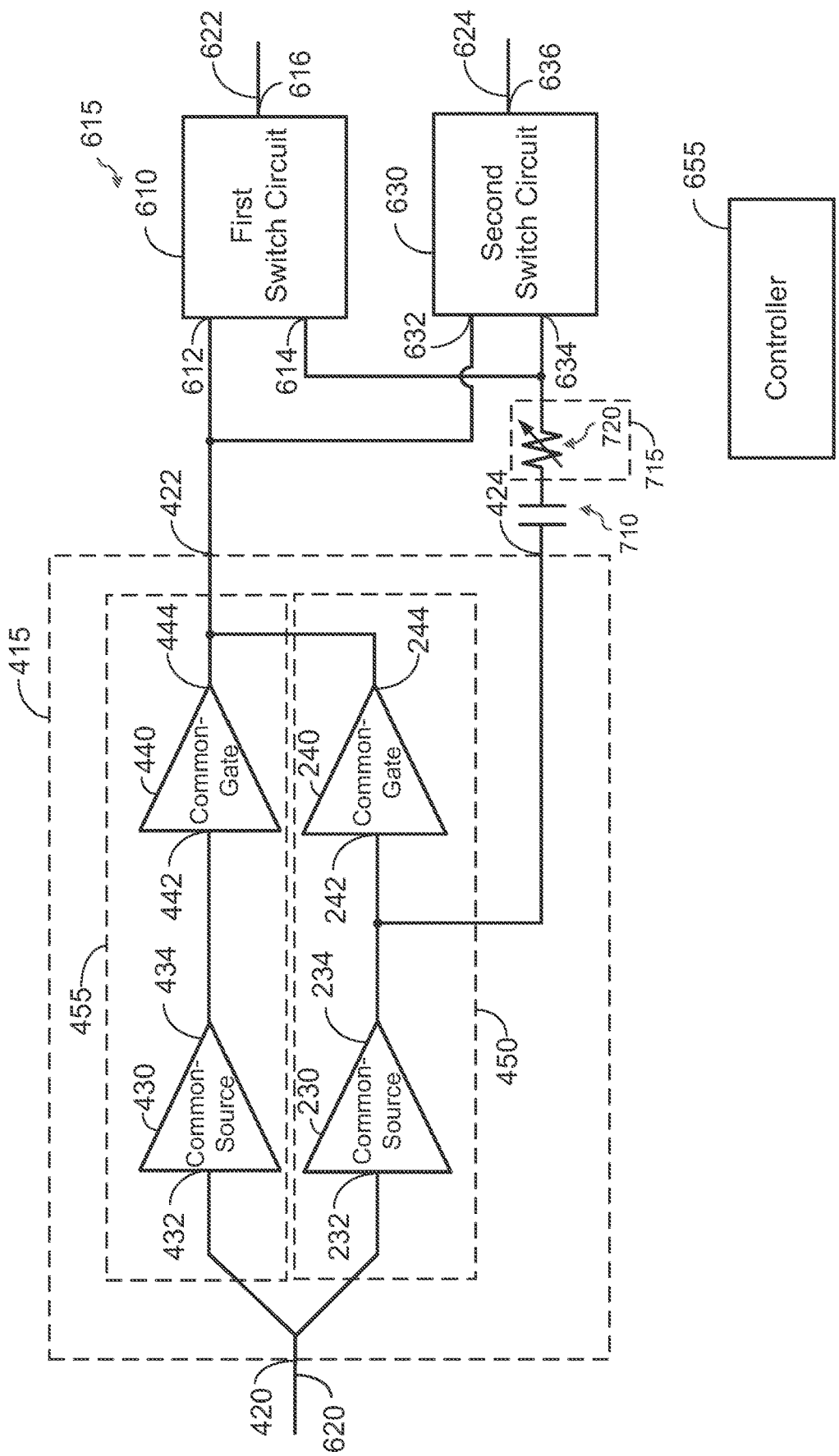
FIG. 7 shows an example of an amplifier circuit including an attenuator according to certain aspects of the present disclosure.

FIG. 7 shows an example in which the amplifier circuit 615 also includes a coupling capacitor 710 and an attenuator 715. In this example, the attenuator 715 is configured to attenuate a signal by an adjustable amount under the control of the controller 655, and the coupling capacitor 710 is used to AC couple the second output 424 of the amplifier circuit 415 to the attenuator 715. The coupling capacitor 710 and the attenuator 715 are coupled in series between the second output 424 of the amplifier circuit 415 and the second inputs 614 and 634 of the first switch circuit 610 and the second switch circuit 630.

In this example, the low gain of the amplifier circuit 615 depends on the low gain of the amplifier circuit 415 and the attenuation by the attenuator 715. Thus, the attenuator 715 allows the controller 655 to adjust the low gain of the amplifier circuit 615 by adjusting the attenuation of the attenuator 715. For example, the controller 655 may decrease the low gain by increasing the attenuation and increase the low gain by decreasing the attenuation.

FIG. 7 shows an example in which the attenuator 715 is implemented with a variable resistor 720. In this example, the controller 655 controls the attenuation of the attenuator 715 by controlling the resistance of the variable resistor 720. More particularly, the controller 655 increases the attenuation by increasing the resistance of the variable resistor 720 and decreases the attenuation by decreasing the resistance of the variable resistor 720. It is to be appreciated that the attenuator 715 is not limited to a variable resistor 720. In other implementations, the attenuator 715 may be implemented with a variable capacitor, a pi-attenuator, or another type of attenuator.

It is to be appreciated that an attenuator (not shown) may also be coupled between the first output 422 of the amplifier circuit 415 and the first inputs 612 and 632 of the first switch circuit 610 and the second switch circuit 630 to adjust the high gain of the amplifier circuit 615. As discussed above, the amplifier circuit 615 is not limited to the amplifier circuit 415. In implementations in which the amplifier circuit 215 is used in place of the amplifier circuit 415, the attenuator 715 is coupled between the second output 224 of the amplifier circuit 215 and the second inputs 614 and 634 of the first switch circuit 610 and the second switch circuit 630.

Figure 8:
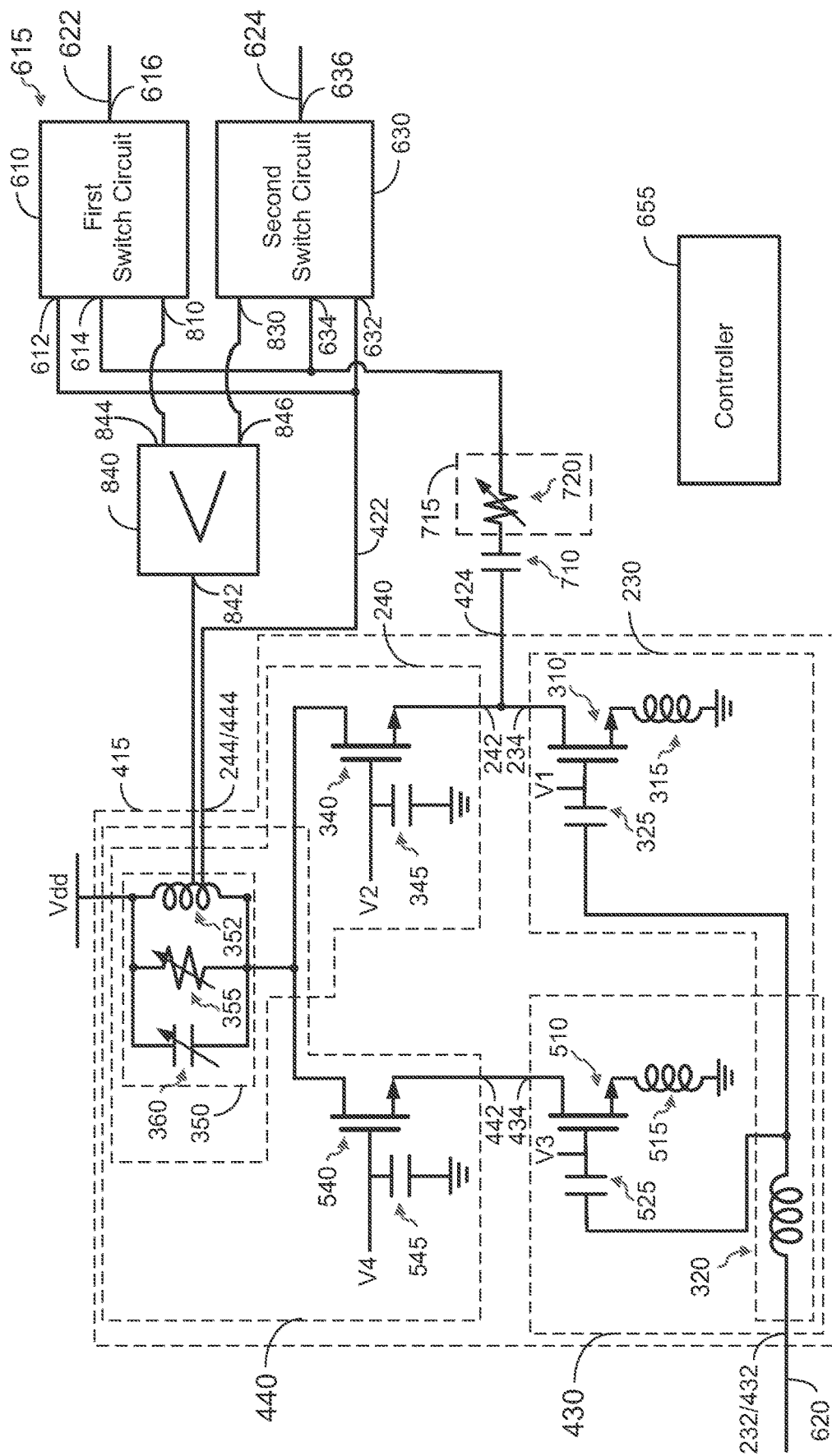
FIG. 8 shows an example of an amplifier circuit including a splitter according to certain aspects of the present disclosure.

FIG. 8 shows an example in which the amplifier circuit 615 also includes a splitter 840 according to certain aspects. The splitter 840 has an input 842, a first output 844, and a second output 846. The splitter 840 is configured to split one or more signals received at the input 842 between the first and second outputs 844 and 846. In the example shown in FIG. 8, the amplifier circuit 415 is implemented with the exemplary implementation shown in FIG. 5 with the input 842 of the splitter 840 coupled to the load inductor 352 of the load 350. In this example, the input 842 of the splitter 840 is coupled to a different point on the load inductor 352 than the first switch circuit 610 and the second switch circuit 630. This may be done, for example, to provide impedance matching with the input 842 of the splitter 840 and impedance matching with the first inputs 612 and 632 of the first switch circuit 610 and the second switch circuit 630.

In this example, the first switch circuit 610 has a third input 810 coupled to the first output 844 of the splitter 840, and the second switch circuit 630 has a third input 830 coupled to the second output 846 of the splitter 840. In this example, the first switch circuit 610 is configured to selectively couple the first input 612, the second input 614, or the third input 810 to the output 616 under the control of the controller 655. The second switch circuit 630 is configured to selectively couple the first input 632, the second input 634, or the third input 830 to the output 636 under the control of the controller 655.

As discussed above, the controller 655 may operate the first switch circuit 610 and the second switch circuit 630 in a first switch mode to use the high-gain path for the first signal and the low-gain path for the second signal, or operate the first switch circuit 610 and the second switch circuit 630 in the second switch mode to use the low-gain path for the first signal and the high-gain path for the second signal. In this example, the controller 655 may also operate the first switch circuit 610 and the second switch circuit 630 in a third switch mode in which the high-gain path is used for both the first signal and the second signal. In the third switch mode, the controller 655 directs the first switch circuit 610 to select the third input 810 of the first switch circuit 610 and the second switch circuit 630 to select the third input 830 of the second switch circuit 630. This causes the first switch circuit 610 to couple the first output 844 of the splitter 840 to the first output 622 of the amplifier circuit 615 (which is coupled to the first receive chain), and the second switch circuit 630 to couple the second output 846 of the splitter 840 to the second output 624 of the amplifier circuit 615 (which is coupled to the second receive chain). Since the splitter 840 splits the high-gain path, both the first signal and the second signal are amplified using the high-gain path in the third switch mode.

In certain aspects, each of the first switch circuit 610 and the second switch circuit 630 may include a respective attenuator (not shown in FIG. 8) for adjustably attenuating the signal propagating through the switch circuit under the control of the controller 655. Examples of the attenuators are discussed below with reference to FIG. 9.

In these aspects, the controller 655 may independently adjust the attenuation of the attenuator in each of the first switch circuit 610 and the second switch circuit 630. This feature allows the controller 655 to adjust the gain for each of the first and second signals in the third switch mode by adjusting the attenuation of the respective attenuator. For example, in the third switch mode, the controller 655 may decrease the gain of the second signal with respect to the gain of the first signal by setting the attenuation of the attenuator in the second switch circuit 630 higher than the attenuation of the attenuator in the first switch circuit 610. Thus, the controller 655 may use the attenuators in the first switch circuit 610 and the second switch circuit 630 to achieve different gains for the first signal and the second signal in the third switch mode by setting the attenuations of the attenuators in the first switch circuit 610 and the second switch circuit 630 to different attenuations. The controller 655 may use the attenuators in the first switch circuit 610 and the second switch circuit 630 to achieve different gains for the first signal and the second signal for cases where the gain difference is relatively small (e.g., due to a small difference in the amplitudes of the first signal and the second signal at the input 620 of the amplifier circuit 615).

For cases where the difference between the gain for the first signal and the gain for the second signal is large (e.g., due to a large difference in the amplitudes of the first signal and the second signal at the input 620 of the amplifier circuit 615), the controller 655 may operate the first switch circuit 610 and the second switch circuit 630 in the first switch mode or the second switch mode. A large difference in the amplitudes of the first signal and the second signal may occur, for example, when the wireless device 205 receives the first signal from a first device (e.g., base station) and the second signal from a second device (e.g., base station) where the first and second devices are located at different distances from the wireless device 205. In this example, the signal received from the device located closer to the wireless device 205 may have a much larger amplitude than the signal received from the device located farther away from the wireless device 205. Examples where the wireless device 205 may receive the first signal and the second signal from devices located at different distances from the wireless device 205 include E-UTRA-NR dual connectivity (ENDC), non-contiguous carrier aggregation (NCAA), multi-SIM (MSIM), dual SIM dual active (DSDA), dual receive dual standby (DRDS), etc. For example, in ENDC, the wireless device 205 may receive the first signal from a first base station (e.g., LTE enodeB) and the second signal from a second base station (e.g., 5G gNB) where the base stations are located at different distances from the wireless device 205. In another example, the first signal may be a LAA signal and the second signal may be a WLAN signal, in which the wireless device 205 receives the LAA signal from a base station and the WLAN signal from a wireless access point (e.g., WiFi access point).

Thus, the controller 655 may determine which switch mode to use based on the difference in the amplitudes of the first signal and the second signal at the input 620 of the amplifier circuit 615. For cases where the amplitude difference is small, the controller 655 may operate the first switch circuit 610 and the second switch circuit 630 in the third switch mode, in which different gains for the signals is achieved by attenuating the signals by different amounts in the first switch circuit 610 and the second switch circuit 630. For cases where the amplitude difference is large, the controller 655 may operate the first switch circuit 610 and the second switch circuit 630 in the first switch mode or the second switch mode depending on which one of the signals has the higher amplitude. In this example, the controller 655 may estimate the amplitudes of the first signal and the second signal based on, for example, receive signal strength measurements of the signals.

It is to be appreciated that, in some implementations, the second common-source amplifier 430 and the second common-gate amplifier 440 shown in FIG. 8 may be omitted (e.g., for a single branch implementation).

Figure 9:
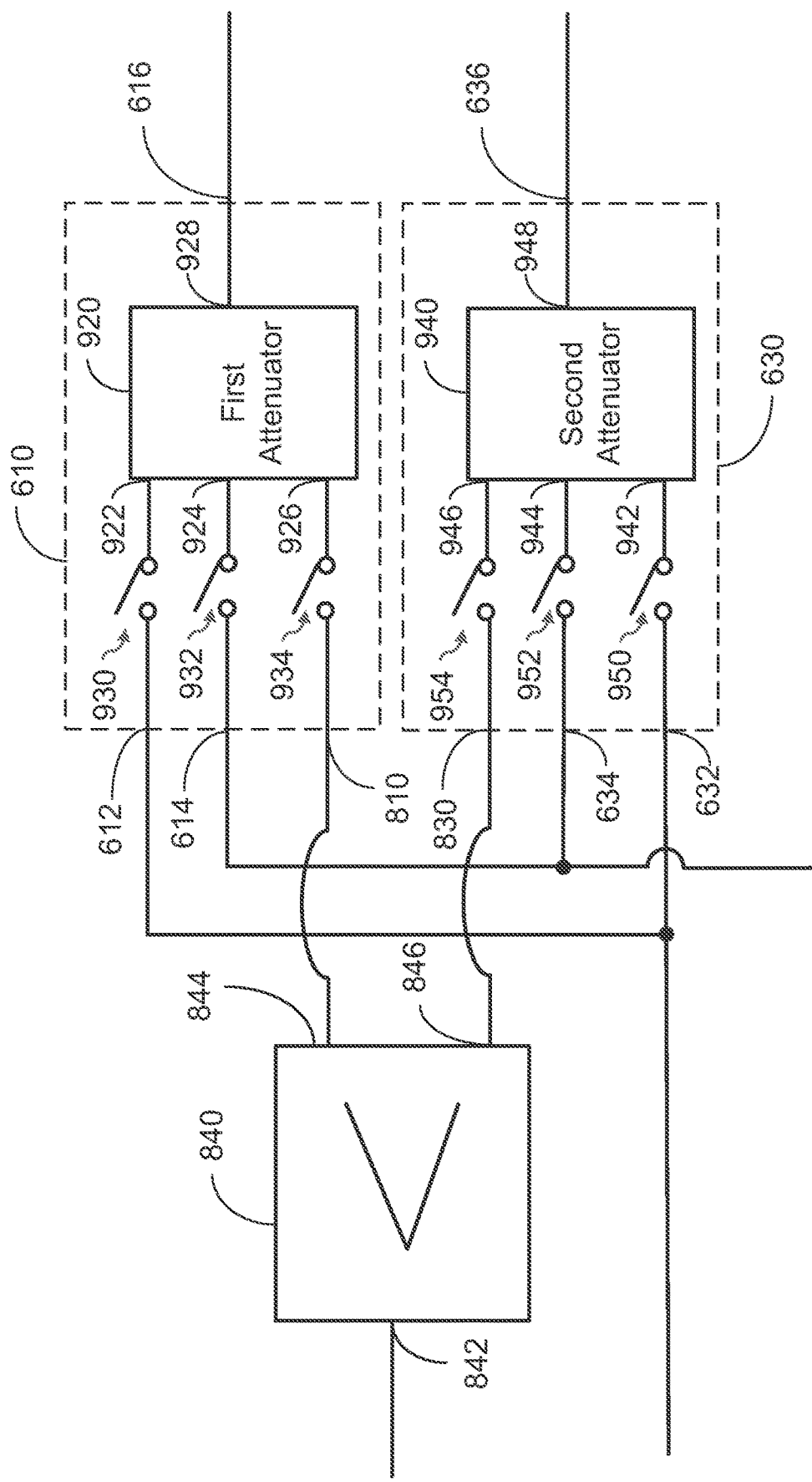
FIG. 9 shows an exemplary implementation of the switch circuits according to certain aspects of the present disclosure.

FIG. 9 shows an exemplary implementation of the first switch circuit 610 and the second switch circuit 630 according to certain aspects. In this example, the first switch circuit 610 includes a first attenuator 920 having a first input 922, a second input 924, a third input 926, and an output 928. The output 928 is coupled to the output 616 of the first switch circuit 610. The first attenuator 920 is configured to attenuate a signal received at any of the inputs 922, 924 and 926 by an adjustable amount under the control of the controller 655 (shown in FIG. 8).

In this example, the first switch circuit 610 also includes a first switch 930, a second switch 932, and a third switch 934. The first switch 930 is coupled between the first input 612 of the first switch circuit 610 and the first input 922 of the first attenuator 920, the second switch 932 is coupled between the second input 614 of the first switch circuit 610 and the second input 924 of the first attenuator 920, and the third switch 934 is coupled between the third input 810 of the first switch circuit 610 and the third input 926 of the first attenuator 920. The on/off states of the switches 930, 932 and 934 are controlled by the controller 655. For ease of illustration, the individual connections between the controller 655 and the switches 930, 932 and 934 are not shown in FIG. 9.

In this example, the second switch circuit 630 includes a second attenuator 940 having a first input 942, a second input 944, a third input 946, and an output 948. The output 948 is coupled to the output 636 of the second switch circuit 630. The second attenuator 940 is configured to attenuate a signal received at any of the inputs 942, 944 and 946 by an adjustable amount under the control of the controller 655 (shown in FIG. 8).

In this example, the second switch circuit 630 also includes a first switch 950, a second switch 952, and a third switch 954. The first switch 950 is coupled between the first input 632 of the second switch circuit 630 and the first input 942 of the second attenuator 940, the second switch 952 is coupled between the second input 634 of the second switch circuit 630 and the second input 944 of the second attenuator 940, and the third switch 954 is coupled between the third input 830 of the second switch circuit 630 and the third input 946 of the second attenuator 940. The on/off states of the switches 950, 952 and 954 are controlled by the controller 655. For ease of illustration, the individual connections between the controller 655 and the switches 950, 952 and 954 are not shown in FIG. 9.

Each of the switches 930, 932, 934, 950, 952, and 954 may be implemented with an NFET, a PFET, a transmission gate, or another type of switch.

In this example, the controller 655 operates the first switch circuit 610 and the second switch circuit 630 in any one of the switch modes discussed above by controlling the on/off states of the switches 930, 932, 934, 950, 952, and 954. For example, to operate the first switch circuit 610 and the second switch circuit 630 in the first switch mode, the controller 655 may turn on the first switch 930 in the first switch circuit 610 and turn on the second switch 952 in the second switch circuit 630 with the remaining switches 932, 934, 950, and 954 turned off. In this mode, the high gain with low NF is used for the first signal and the low gain with high linearity is used for the second signal. Also, the controller 655 may adjust the high gain by adjusting the attenuation of the first attenuator 920 and/or adjust the low gain by adjusting the attenuation of the second attenuator 940.

To operate the first switch circuit 610 and the second switch circuit 630 in the second switch mode, the controller 655 may turn on the second switch 932 in the first switch circuit 610 and turn on the first switch 950 in the second switch circuit 630 with the remaining switches 930, 934, 952, and 954 turned off. In this mode, the high gain with low NF is used for the second signal and the low gain with high linearity is used for the first signal. Also, the controller 655 may adjust the high gain by adjusting the attenuation of the second attenuator 940 and/or adjust the low gain by adjusting the attenuation of the first attenuator 920.

As discussed above, the first switch mode or the second switch mode may be used in cases where the difference between the gain for the first signal and the gain for the second signal is large (e.g., due to a large difference in the amplitudes of the first signal and second signal at the input 620 of the amplifier circuit 615). For instance, the first switch mode or the second switch mode may be used for an example where the high gain is 18 dB and the low gain is −14 dB.

To operate the first switch circuit 610 and the second switch circuit 630 in the third switch mode, the controller 655 may turn on the third switch 934 in the first switch circuit 610 and turn on the third switch 954 in the second switch circuit 630 with the remaining switches 930, 932, 950 and 952 turned off.

As discussed above, the controller 655 may operate the first switch circuit 610 and the second switch circuit 630 in the third switch mode for cases were the gain difference between the first signal and the second signal is relatively small (e.g., due to a small difference in the amplitudes of the first signal and the second signal at the input 620 of the amplifier circuit 615). For instance, the third mode may be used for an example where one of the gains is 18 dB and the other gain is 12 dB. In these cases, the NF and linearity specifications for the first signal and the second signal may be close, in which case the high-gain path of the amplifier circuit 615 may be able to meet the specifications for both signals.

In these cases, the controller 655 achieves the gain difference between the first signal and the second signal using the first attenuator 920 and the second attenuator 940. For example, the controller 655 may set the gain of the second signal lower than the gain of the first signal by setting the attenuation of the second attenuator 940 higher than the attenuation of the first attenuator 920. Similarly, the controller 655 may set the gain of the first signal lower than the gain of the second signal by setting the attenuation of the first attenuator 920 higher than the attenuation of the second attenuator 940.

The third switch mode may also be used for cases where the gain for the first signal and the gain for the second signal are approximately the same. In these cases, the gain for the first signal and the second signal may be adjusted by adjusting the attenuations of the first attenuator 920 and the second attenuator 940 by approximately the same amount and/or adjusting the resistance of the variable resistor 355 shown in FIG. 8.

In certain aspects, the controller 655 may support a fourth switch mode for the case where the amplifier circuit 615 only receives one of the first signal and the second signal. This may occur, for example, in use cases where only one of the signals is being used. In these aspects, the amplifier circuit 615 may amplify the signal using the high-gain path and output the signal after amplification to the first switch circuit 610 and the second switch circuit 630 from the first output 422. The controller 655 may then direct the first switch circuit 610 to pass the signal to the first output 622 or the second switch circuit 630 to pass the signal to the second output 624 depending on whether the signal is the first signal or the second signal. For example, if the signal is the first signal, then the controller 655 may close the first switch 930 in the first switch circuit 610 and open the remaining switches 932, 934, 950, 952, and 954. In this case, the signal is passed to the first receive chain (not shown in FIG. 9) coupled to the first output 622. If the signal is the second signal, then the controller 655 may close the first switch 950 in the second switch circuit 630 and open the remaining switches 930, 932, 934, 952, and 954. In this case, the signal is passed to the second receive chain (not shown in FIG. 9) coupled to the second output 624.

In the above example, the high-gain path is used for both the first signal and the second signal for cases where the gain difference between the first signal and the second signal is relatively small. However, it is to be appreciated that the amplifier circuit 615 is not limited to this example. For example, in some implementations, the low-gain path may be used for both the first signal and the second signal for cases where the gain difference between the first signal and the second signal is relatively small and the gains for the first signal and the second signal are both low (e.g., the gains are below a gain threshold). In this example, the amplifier circuit 615 may include a second splitter (not shown) that splits the low-gain path between the first switch circuit 610 and the second switch circuit 630. In this example, different gains for the first signal and the second signal may be achieved by setting the attenuations of the first attenuator 920 and the second attenuator 940 to different attenuations. In this example, the high-gain path may be used for both the first signal and the second signal for cases where the gain difference between the first signal and the second signal is relatively small and the gains for the first signal and the second signal are both high (e.g., the gains are above the gain threshold).

The controller 655 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Figure 10:
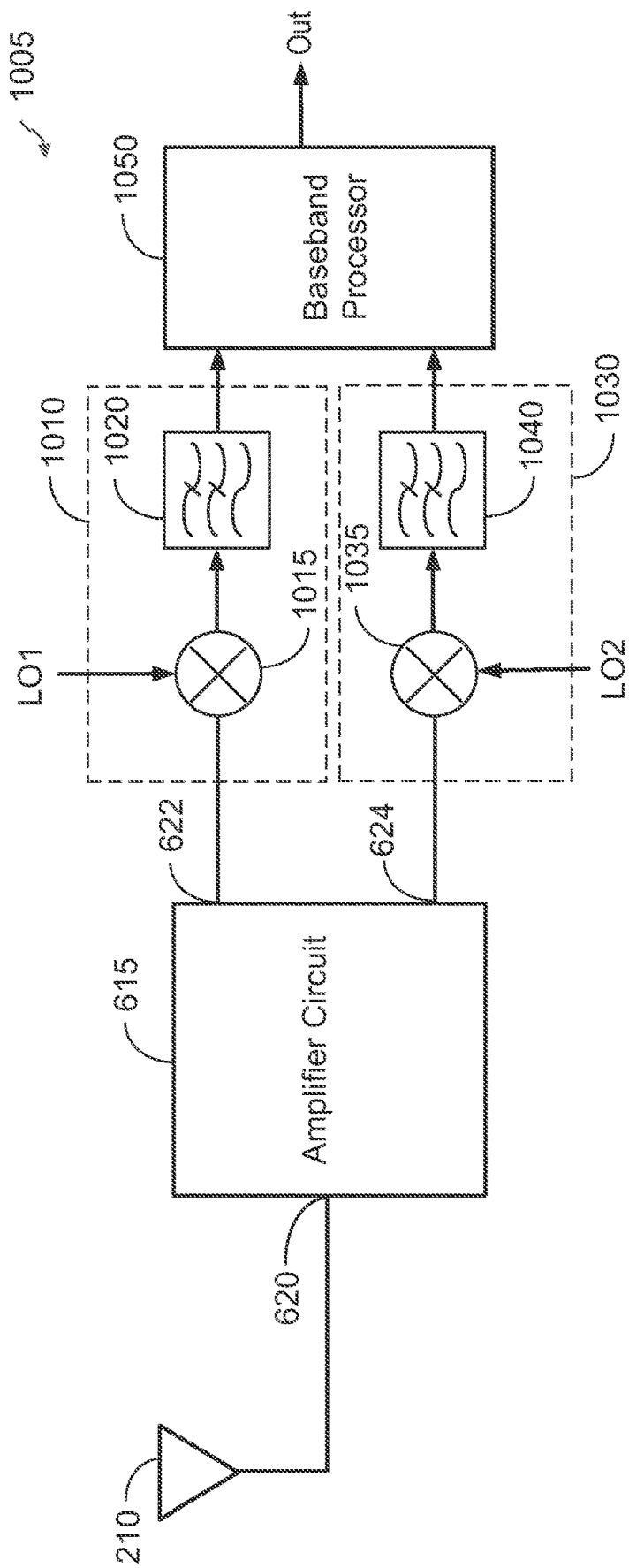
FIG. 10 shows an example of receive chains coupled to an amplifier circuit according to certain aspects of the present disclosure.

FIG. 10 shows an example of a wireless device 1005 according to certain aspects. The wireless device 1005 includes the antenna 210 and the amplifier circuit 615 with the input 620 of the amplifier circuit 615 coupled to the antenna 210. The wireless device 1005 also includes the first receive chain 1010, the second receive chain 1030, and a baseband processor 1050. The input of the first receive chain 1010 is coupled to the first output 622 of the amplifier circuit 615, and the input of the second receive chain 1030 is coupled to the second output 624 of the amplifier circuit 615. As discussed above, the first receive chain 1010 is configured to process the first signal and the second receive chain 1030 is configured to process the second signal where the first and second signal may be in different technologies or the same technology.

The first receive chain 1010 may include a first mixer 1015 and a first filter 1020. The input of the first mixer 1015 is coupled to the first output 622 of the amplifier circuit 615 and the output of the first mixer 1015 is coupled to the input of the first filter 1020 (e.g., lowpass filter or bandpass filter). The output of the first filter 1020 is coupled to the baseband processor 1050. It is to be appreciated that the first receive chain 1010 may include one or more additional components not shown in FIG. 10.

In operation, the first mixer 1015 is configured to mix the first signal with a first local oscillator signal ("LO1") to frequency down-convert the first signal into a baseband signal. The first filter 1020 is configured to filter the baseband signal to remove noise and/or other unwanted signals. The baseband processor 1050 is configured to process the filtered baseband signal to recover information (e.g., user data) from the filtered baseband signal. The processing by the baseband processor 1050 may include sampling, demodulation, decoding, etc. The baseband processor 1050 may output the recovered information to one or more processors (not shown) on the wireless device for further processing. The one or more processors may include one or more central processing unit (CPU) cores.

In this example, the second receive chain 1030 includes a second mixer 1035 and a second filter 1040. The input of the second mixer 1035 is coupled to the second output 624 of the amplifier circuit 615 and the output of the second mixer 1035 is coupled to the input of the second filter 1040 (e.g., lowpass filter or bandpass filter). The output of the second filter 1040 is coupled to the baseband processor 1050. It is to be appreciated that the second receive chain 1030 may include one or more additional components not shown in FIG. 10.

In operation, the second mixer 1035 is configured to mix the second signal with a second local oscillator signal ("LO2") to frequency down-convert the second signal into a baseband signal. The second local oscillator signal may have a different frequency than the first local oscillator signal (e.g., for the case where the first signal and second signal have different center frequencies). The second filter 1040 is configured to filter the baseband signal to remove noise and/or other unwanted signals. The baseband processor 1050 is configured to process the filtered baseband signal to recover information (e.g., user data) from the filtered baseband signal. The processing by the baseband processor 1050 may include sampling, demodulation, decoding, etc. The baseband processor 1050 may output the recovered information to the one or more processors (not shown) discussed above.

It is to be appreciated that the wireless device 1005 is not limited to the amplifier circuit 615. In other implementations, the wireless device 1005 may include the amplifier circuit 215 with the input 220 coupled to the antenna 210, the first output 222 coupled to the input of the first receive chain 1010, and the second output 224 coupled to the input of the second receive chain 1030. Similarly, in other implementations, the wireless device 1005 may include the amplifier circuit 415 with the input 420 coupled to the antenna 210, the first output 422 coupled to the input of the first receive chain 1010, and the second output 424 coupled to the input of the second receive chain 1030.

Figure 11:
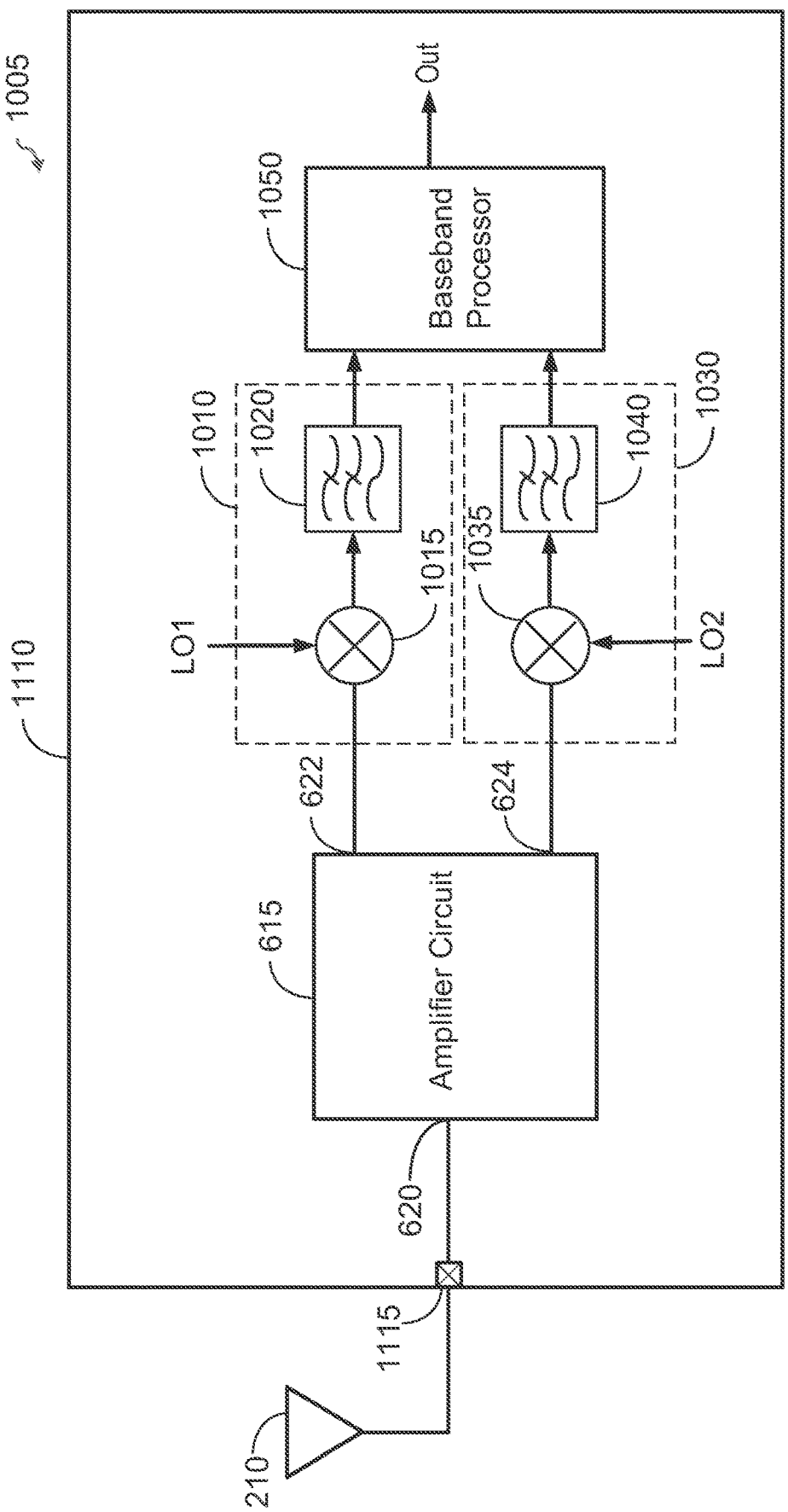
FIG. 11 shows an example in which the amplifier circuit and the receive chains are integrated on a chip according to certain aspects of the present disclosure.

FIG. 11 shows an example in which the amplifier circuit 615, the first receive chain 1010, the second receive chain 1030, and the baseband processor 1050 are integrated on a chip 1110. In this example, the chip 1110 includes a pad 1115 (e.g., bond pad) coupled to the input 620 of the amplifier circuit 615. The pad 1115 is configured to couple the input 620 of the amplifier circuit 615 to the antenna 210, which is external to the chip 1110 in this example. The pad 1115 may be coupled to the antenna 210 via a metal line, a transmission line, a cable, etc. For example, the chip 1110 and the antenna 210 may be mounted on a substrate (e.g., printed circuit board) in which the antenna 210 is coupled to the pad 1115 via one or more metal traces on the substrate.

It is to be appreciated that the wireless device 1005 may include additional components not shown in FIG. 11. For example, the wireless device 1005 may include an additional amplifier (e.g., LNA), a matching network, a duplexer, a switch, a filter, and/or an electrostatic discharge protection circuit between the antenna 210 and the amplifier circuit 615. For example, the wireless device 1005 may include a duplexer (not shown) between the antenna and the amplifier circuit 615 to couple a transmitter (not shown) to the antenna 210.

Figure 12:
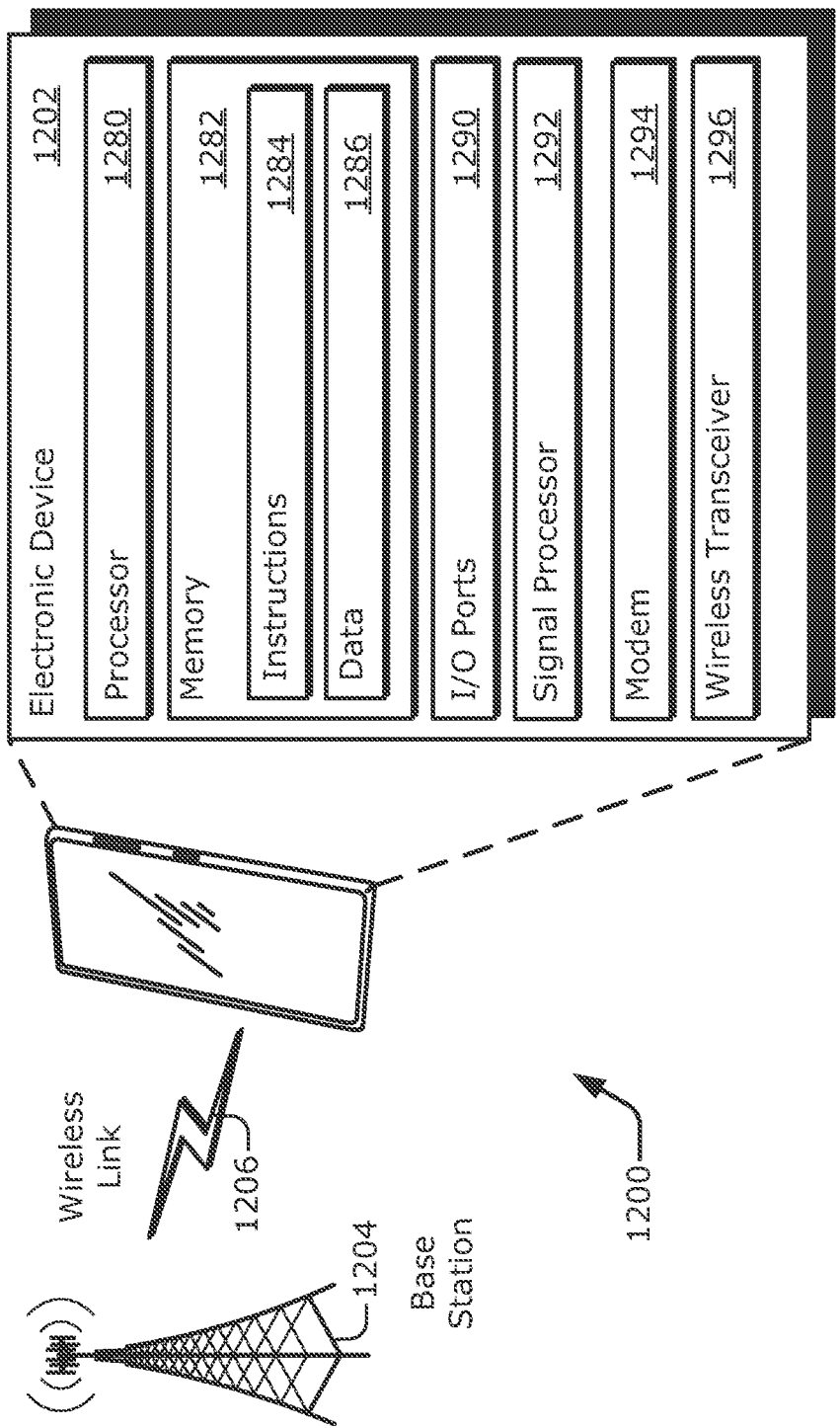
FIG. 12 is a diagram of an environment that includes an electronic device that includes a transceiver according to certain aspects of the present disclosure.

FIG. 12 is a diagram of an environment 1200 that includes an electronic device 1202 that includes a wireless transceiver 1296. The wireless transceiver 1296 may include the amplifier circuit 215, the amplifier circuit 415, the amplifier circuit 615, the first receive chain 1010, and/or the second receive chain 1030. In the environment 1200, the electronic device 1202 communicates with a base station 1204 through a wireless link 1206. As shown, the electronic device 1202 is depicted as a smart phone. However, the electronic device 1202 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1204 communicates with the electronic device 1202 via the wireless link 1206, which may be implemented as any suitable type of wireless link. Although depicted as a base station tower of a cellular radio network, the base station 1204 may represent or be implemented as another device, such as a satellite, terrestrial broadcast tower, access point, peer to peer device, mesh network node, fiber optic line, another electronic device generally as described above, and so forth. Hence, the electronic device 1202 may communicate with the base station 1204 or another device via a wired connection, a wireless connection, or a combination thereof. The wireless link 1206 can include a downlink of data or control information communicated from the base station 1204 to the electronic device 1202 and an uplink of other data or control information communicated from the electronic device 1202 to the base station 1204. The wireless link 1206 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1202 includes a processor 1280 and a memory 1282. The memory 1282 may be or form a portion of a computer readable storage medium. The processor 1280 may include any type of processor, such as an application processor or a multi-core processor, that is configured to execute processor-executable instructions (e.g., code) stored by the memory 1282. The memory 1282 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1282 is implemented to store instructions 1284, data 1286, and other information of the electronic device 1202, and thus when configured as or part of a computer readable storage medium, the memory 1282 does not include transitory propagating signals or carrier waves.

The electronic device 1202 may also include input/output (I/O) ports 1290. The I/O ports 1290 enable data exchanges or interaction with other devices, networks, or users or between components of the device.

The electronic device 1202 may further include a signal processor (SP) 1292 (e.g., such as a digital signal processor (DSP)). The signal processor 1292 may function similar to the processor and may be capable executing instructions and/or processing information in conjunction with the memory 1282.

For communication purposes, the electronic device 1202 also includes a modem 1294, the wireless transceiver 1296, and an antenna (not shown). The wireless transceiver 1296 provides connectivity to respective networks and other electronic devices connected therewith using RF wireless signals. The wireless transceiver 1296 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 13:
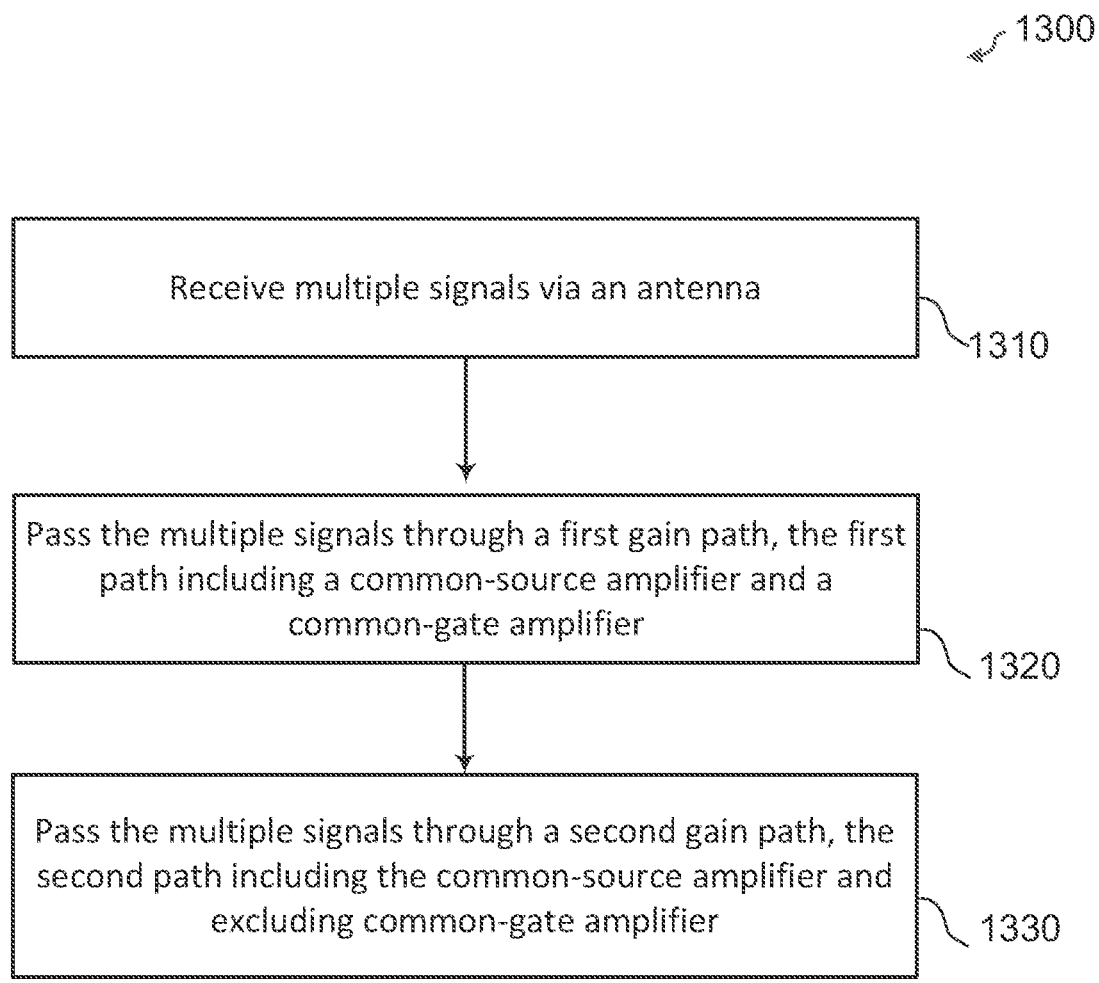
FIG. 13 is a flowchart illustrating a method for wireless communications according to certain aspects of the present disclosure.

FIG. 13 is a flowchart illustrating a method 1300 for wireless communications according to certain aspects. The method 1300 may be performed by any of the exemplary amplifier circuit 215, amplifier circuit 415, and amplifier circuit 615 discussed above.

At block 1310, multiple signals are received via an antenna. The antenna may correspond to antenna 210. The multiple signals may have different amplitudes. The multiple signals may be in different communications technologies. For example, the multiple signals may include a first signal and a second signal where each of the first signal and the second signal is in a different one of the following technologies: 4G, 5G, and WLAN.

At block 1320, the multiple signals are passed through a first gain path, the first gain path including a common-source amplifier and a common-gate amplifier. The common-source amplifier may correspond to common-source amplifier 230 and the common-gate amplifier may correspond to the common-gate amplifier 240. In this example, the first gain path may correspond to the high-gain path discussed above according to certain aspects.

At block 1330, the multiple signals are passed through a second gain path, the second gain path including the common-source amplifier and excluding the common-gate amplifier. The second gain path may correspond to the low-gain path discussed above according to certain aspects.

In certain aspects, the second gain path may include an attenuator (e.g., attenuator 715).

In one example, the method 1300 may be performed in a receiver including a first receive chain (e.g., first receive chain 1010) configured to process a first signal, and a second receive chain (e.g., second receive chain 1030) configured to process a second signal. In this example, the multiple signals include the first signal and the second signal. Also, in this example, the gain of the first gain path may be used for the first signal by routing the multiple signals passing through the first gain path to the first receive chain, and the gain of the second gain path may be used for the second signal by routing the multiple signals passing through the second gain path to the second receive chain. Conversely, the gain of the first gain path may be used for the second signal by routing the multiple signals passing through the first gain path to the second receive chain, and the gain of the second gain path may be used for the first signal by routing the multiple signals passing through the second gain path to the first receive chain.

The method 1300 may optionally include, in a first mode (e.g., first switch mode), routing the multiple signals passing through the first gain path to the first receive chain, and, in a second mode (e.g., second switch mode), routing the multiple signals passing through the first gain path to the second receive chain.

The method 1300 may also optionally include, in the first mode, routing the multiple signals passing through the second gain path to the second receive chain, and, in the second mode, routing the multiple signals passing through the second gain path to the first receive chain.

The method 1300 may further optionally include, in a third mode (e.g., the third switch mode), splitting the multiple signals passing through the first gain path into a first split signal and a second split signal, attenuating the first split signal by a first attenuation, and attenuating the second split signal by a second attenuation, wherein the second attenuation is different from the first attenuation. For example, the multiple signals may be split by the splitter 840, in which the first split signal is output from the first output 844 of the splitter 840 and the second split signal is output from the second output 846 of the splitter 840. The first split signal may be attenuated by the first attenuator 920, and the second split signal may be attenuated by the second attenuator 940.

Implementation examples are described in the following numbered clauses:

1. A receiver, comprising:
    an amplifier circuit, wherein the amplifier circuit includes:
        a first common-source amplifier having an input and an output; and
        a first common-gate amplifier having an input and an output, wherein the input of the first common-gate amplifier is coupled to the output of the first common-source amplifier;
    a first receive chain coupled to the output of the first common-gate amplifier; and
    a second receive chain coupled to the output of the first common-source amplifier.

2. The receiver of clause 1, further comprising an antenna coupled to the input of the first common-source amplifier.

3. The receiver of clause 1 or 2, wherein the first receive chain comprises a first mixer coupled to the output of the first common-gate amplifier, and the second receive chain comprises a second mixer coupled to the output of the first common-source amplifier.

4. The receiver of clause 3, further comprising a baseband processor coupled to the first receive chain and the second receive chain.

5. The receiver of clause 4, wherein the first receive chain further comprises a first filter coupled between the first mixer and the baseband processor, and the second receive chain further comprises a second filter coupled between the second mixer and the baseband processor.

6. The receiver of any one of clauses 1 to 5, wherein the first common-source amplifier comprises:
    a first transistor having a source, a gate, and a drain, wherein the gate of the first transistor is coupled to the input of the first common-source amplifier, and the drain of the first transistor is coupled to the output of the first common-source amplifier; and
    a source-degeneration inductor coupled between the source of the first transistor and a ground.

7. The receiver of clause 6, wherein the first common-source amplifier further comprises a gate inductor coupled between the input of the first common-source amplifier and the gate of the first transistor.

8. The receiver of clause 6 or 7, wherein the first common-gate amplifier comprises:
    a second transistor having a source, a gate, and a drain, wherein the source of the second transistor is coupled to the input of the first common-gate amplifier, and the gate of the second transistor is coupled to a bias circuit; and
    a load coupled to the drain of the second transistor.

9. The receiver of clause 8, wherein the load comprises a load inductor.

10. The receiver of clause 9, wherein the output of the first common-gate amplifier is coupled to the load inductor.

11. The receiver of any one of clauses 1 to 10, wherein the amplifier circuit further comprises:
    a second common-source amplifier having an input and an output, wherein the input of the second common-source amplifier is coupled to the input of the first common-source amplifier; and
    a second common-gate amplifier having an input and an output, wherein the input of the second common-gate amplifier is coupled to the output of the second common-source amplifier, and the output of the second common-gate amplifier is coupled to the output of the first common-gate amplifier.

12. A receiver, comprising:
an amplifier circuit, wherein the amplifier circuit includes:
a first common-source amplifier having an input and an output; and
a first common-gate amplifier having an input and an output, wherein the input of the first common-gate amplifier is coupled to the output of the first common-source amplifier;
a first switch circuit having a first input, a second input, and an output, wherein the first input of the first switch circuit is coupled to the output of the first common-gate amplifier, and the second input of the first switch circuit is coupled to the output of the first common-source amplifier; and
a second switch circuit having a first input, a second input, and an output, wherein the first input of the second switch circuit is coupled to the output of the first common-gate amplifier, and the second input of the second switch circuit is coupled to the output of the first common-source amplifier.

13. The receiver of clause 12, further comprising an antenna coupled to the input of the first common-source amplifier.

14. The receiver of clause 12 or 13, further comprising:
a first receive chain coupled to the output of the first switch circuit; and
a second receive chain coupled to the output of the second switch circuit.

15. The receiver of clause 14, wherein the first receive chain comprises a first mixer coupled to the output of the first switch circuit, and the second receive chain comprises a second mixer coupled to the output of the second switch circuit.

16. The receiver of clause 15, wherein the first receive chain further comprises a first filter coupled between the first mixer and a baseband processor, and the second receive chain further comprises a second filter coupled between the second mixer and the baseband processor.

17. The receiver of any one of clauses 12 to 16, wherein the amplifier circuit further comprises a splitter having an input, a first output, and a second output, wherein the input of the splitter is coupled to the output of the first common-gate amplifier, the first output of the splitter is coupled to a third input of the first switch circuit, and the second output of the splitter is coupled to a third input of the second switch circuit.

18. The receiver of clause 17, wherein the first switch circuit comprises a first attenuator, and the second switch circuit comprises a second attenuator.

19. The receiver of any one of clauses 12 to 18, further comprising an attenuator, wherein the attenuator is coupled between the output of the first common-source amplifier and the first input of the first switch circuit, and the attenuator is coupled between the output of the first common-source amplifier and the first input of the second switch circuit.

20. The receiver of clause 19, wherein the attenuator comprises a variable resistor.

21. The receiver of any one of clauses 12 to 20, wherein the first common-source amplifier comprises:
a first transistor having a source, a gate, and a drain, wherein the gate of the first transistor is coupled to the input of the first common-source amplifier, and the drain of the first transistor is coupled to the output of the first common-source amplifier; and
a source-degeneration inductor coupled between the source of the first transistor and a ground.

22. The receiver of clause 21, wherein the first common-source amplifier further comprises a gate inductor coupled between the input of the first common-source amplifier and the gate of the first transistor.

23. The receiver of clause 21 or 22, wherein the first common-gate amplifier comprises:
a second transistor having a source, a gate, and a drain, wherein the source of the second transistor is coupled to the input of the first common-gate amplifier, and a gate of the second transistor is coupled to a bias circuit; and
a load coupled to the drain of the second transistor.

24. The receiver of clause 23, wherein the load comprises a load inductor.

25. The receiver of clause 24, wherein the output of the first common-gate amplifier is coupled to the load inductor.

26. The receiver of any one of clauses 12 to 25, wherein the amplifier circuit further comprises:
a second common-source amplifier having an input and an output, wherein the input of the second common-source amplifier is coupled to the input of the first common-source amplifier; and
a second common-gate amplifier having an input and an output, wherein the input of the second common-gate amplifier is coupled to the output of the second common-source amplifier, and the output of the second common-gate amplifier is coupled to the output of the first common-gate amplifier.

27. The receiver of any one of clauses 12 to 26, further comprising a controller coupled to the first switch circuit and the second switch circuit, wherein the controller is configured to:
in a first mode, cause the first switch circuit to couple the first input of the first switch circuit to the output of the first switch circuit, and cause the second switch circuit to couple the second input of the second switch circuit to the output of the second switch circuit; and
in a second mode, cause the first switch circuit to couple the second input of the first switch circuit to the output of the first switch circuit, and cause the second switch circuit to couple the first input of the second switch circuit to the output of the second switch circuit.

28. A method for wireless communications, comprising:
receiving multiple signals via an antenna;
passing the multiple signals through a first gain path, the first gain path including a common-source amplifier and a common-gate amplifier; and
passing the multiple signals through a second gain path, the second gain path including the common-source amplifier and excluding the common-gate amplifier.

29. The method of clause 28, wherein the second gain path includes an attenuator.

30. The method of clause 29, wherein the first gain path excludes the attenuator.

31. The method of any one of clauses 28 to 30, further comprising:
mixing the multiple signals passing through the first gain path with a first oscillator signal; and
mixing the multiple signals passing through the second gain path with a second oscillator signal.

32. The method of clause 31, wherein the first oscillator signal and the second oscillator signal have different frequencies.

33. The method of any one of clauses 28 to 32, further comprising:
in a first mode, routing the multiple signals passing through the first gain path to a first receive chain; and in a second mode, routing the multiple signals passing through the first gain path to a second receive chain.

34. The method of clause 33, further comprising:
in the first mode, routing the multiple signals passing through the second gain path to the second receive chain; and
in the second mode, routing the multiple signals passing through the second gain path to the first receive chain.

35. The method of clause 34, further comprising:
in a third mode, splitting the multiple signals passing through the first gain path into a first split signal and a second split signal;
attenuating the first split signal by a first attenuation; and
attenuating the second split signal by a second attenuation, wherein the second attenuation is different from the first attenuation.

36. A receiver, comprising:
an amplifier circuit, wherein the amplifier circuit includes:
a first transistor having a source, a gate, and a drain;
a second transistor having a source, a gate, and a drain, wherein the source of the second transistor is coupled to the drain of the first transistor, and the gate of the second transistor is coupled to a bias circuit;
a third transistor having a source, a gate, and a drain;
a fourth transistor having a source, a gate, and a drain, wherein the source of the fourth transistor is coupled to the drain of the third transistor, and the gate of the fourth transistor is coupled to the bias circuit; and
a load coupled to the drain of the second transistor and the drain of the fourth transistor;
wherein an input of the amplifier circuit is coupled to the gate of the first transistor and the gate of the third transistor, a first output of the amplifier circuit is coupled to the load, and a second output of the amplifier circuit is coupled between the drain of the first transistor and the source of the second transistor.

37. The receiver of clause 36, wherein the load comprises an inductor.

38. The receiver of clause 36 or 37, wherein the amplifier circuit comprises:
a first source-degeneration inductor coupled between the source of the first transistor and a ground; and
a second source-degeneration inductor coupled between the source of the third transistor and the ground.

39. The receiver of any one of clauses 36 to 38, further comprising:
a first switch circuit having a first input, a second input, and an output, wherein the first input of the first switch circuit is coupled to the first output of the amplifier circuit, and the second input of the first switch circuit is coupled to the second output of the amplifier circuit; and
a second switch circuit having a first input, a second input, and an output, wherein the first input of the second switch circuit is coupled to the first output of the amplifier circuit, and the second input of the second switch circuit is coupled to the second output of the amplifier circuit.

40. The receiver of clause 39, further comprising:
a first receive chain coupled to the output of the first switch circuit; and
a second receive chain coupled to the output of the second switch circuit.

41. The receiver of clause 40, wherein the first receive chain comprises a first mixer coupled to the output of the first switch circuit, and the second receive chain comprises a second mixer coupled to the output of the second switch circuit.

42. The receiver of any one of clauses 39 to 41, further comprising a splitter having an input, a first output, and a second output, wherein the input of the splitter is coupled to the load, the first output of the splitter is coupled to a third input of the first switch circuit, and the second output of the splitter is coupled to a third input of the second switch circuit.

43. The receiver of any one of clauses 39 to 42, wherein the first switch circuit comprises a first attenuator, and the second switch circuit comprises a second attenuator.

44. The receiver of any one of clauses 39 to 43, further comprising a controller coupled to the first switch circuit and the second switch circuit, wherein the controller is configured to:
in a first mode, cause the first switch circuit to couple the first input of the first switch circuit to the output of the first switch circuit, and cause the second switch circuit to couple the second input of the second switch circuit to the output of the second switch circuit; and
in a second mode, cause the first switch circuit to couple the second input of the first switch circuit to the output of the first switch circuit, and cause the second switch circuit to couple the first input of the second switch circuit to the output of the second switch circuit.

It is to be appreciated that the present disclosure is not limited to the exemplary terminology used above to describe aspects of the present disclosure. For example, a switch circuit may also be referred to as a multiplexer or another term.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property and/or within typical manufacturing and design tolerances.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel feature disclosed herein.

What is claimed is:
1. A receiver, comprising:
an amplifier circuit, wherein the amplifier circuit includes:
a first common-source amplifier having an input and an output, the first common-source amplifier comprising:
a first transistor having a source, a gate, and a drain, wherein the gate of the first transistor is coupled to the input of the first common-source amplifier, and the drain of the first transistor is coupled to the output of the first common-source amplifier;
a source-degeneration inductor coupled between the source of the first transistor and a ground; and a gate inductor coupled between the input of the first common-source amplifier and the gate of the first transistor; and a first common-gate amplifier having an input and an output, wherein the input of the first common-gate amplifier is coupled to the output of the first common-source amplifier;

a first receive chain coupled to the output of the first common-gate amplifier; and a second receive chain coupled to the output of the first common-source amplifier.

2. The receiver of claim 1, further comprising an antenna coupled to the input of the first common-source amplifier.

3. The receiver of claim 1, wherein the first receive chain comprises a first mixer coupled to the output of the first common-gate amplifier, and the second receive chain comprises a second mixer coupled to the output of the first common-source amplifier.

4. The receiver of claim 3, wherein the first receive chain further comprises a first filter coupled between the first mixer and a baseband processor, and the second receive chain further comprises a second filter coupled between the second mixer and the baseband processor.

5. The receiver of claim 1, wherein the first common-gate amplifier comprises:

a second transistor having a source, a gate, and a drain, wherein the source of the second transistor is coupled to the input of the first common-gate amplifier, and the gate of the second transistor is coupled to a bias circuit; and a load coupled to the drain of the second transistor.

6. The receiver of claim 5, wherein the load comprises a load inductor, and the output of the first common-gate amplifier is coupled to the load inductor.

7. The receiver of claim 5, further comprising a bias circuit, wherein the gate of the first transistor is coupled to the bias circuit via a first resistor and the gate of the second transistor is coupled to the bias circuit via a second resistor.

8. A receiver, comprising:

an amplifier circuit, wherein the amplifier circuit includes:
 a first common-source amplifier having an input and an output; and
 a first common-gate amplifier having an input and an output, wherein the input of the first common-gate amplifier is coupled to the output of the first common-source amplifier;

a first switch circuit having a first input, a second input, and an output, wherein the first input of the first switch circuit is coupled to the output of the first common-gate amplifier, and the second input of the first switch circuit is coupled to the output of the first common-source amplifier;

a second switch circuit having a first input, a second input, and an output, wherein the first input of the second switch circuit is coupled to the output of the first common-gate amplifier, and the second input of the second switch circuit is coupled to the output of the first common-source amplifier; and an attenuator, wherein the attenuator is coupled between the output of the first common-source amplifier and the first input of the first switch circuit, and the attenuator is coupled between the output of the first common-source amplifier and the first input of the second switch circuit.

9. The receiver of claim 1, wherein the amplifier circuit further comprises:

a second common-source amplifier having an input and an output, wherein the input of the second common-source amplifier is coupled to the input of the first common-source amplifier; and a second common-gate amplifier having an input and an output, wherein the input of the second common-gate amplifier is coupled to the output of the second common-source amplifier, and the output of the second common-gate amplifier is coupled to the output of the first common-gate amplifier.

10. A receiver, comprising:

an amplifier circuit, wherein the amplifier circuit includes:
 a first common-source amplifier having an input and an output; and
 a first common-gate amplifier having an input and an output, wherein the input of the first common-gate amplifier is coupled to the output of the first common-source amplifier;

a first switch circuit having a first input, a second input, and an output, wherein the first input of the first switch circuit is coupled to the output of the first common-gate amplifier, and the second input of the first switch circuit is coupled to the output of the first common-source amplifier;

a second switch circuit having a first input, a second input, and an output, wherein the first input of the second switch circuit is coupled to the output of the first common-gate amplifier, and the second input of the second switch circuit is coupled to the output of the first common-source amplifier; and a splitter having an input, a first output, and a second output, wherein the input of the splitter is coupled to the output of the first common-gate amplifier, the first output of the splitter is coupled to a third input of the first switch circuit, and the second output of the splitter is coupled to a third input of the second switch circuit.

11. The receiver of claim 10, further comprising:

a first receive chain coupled to the output of the first switch circuit, the first receive chain comprising a first mixer; and a second receive chain coupled to the output of the second switch circuit, the second receive chain comprising a second mixer.

12. The receiver of claim 11, wherein the first receive chain further comprises a first filter coupled between the first mixer and a baseband processor, and the second receive chain further comprises a second filter coupled between the second mixer and the baseband processor.

13. The receiver of claim 10, further comprising a controller coupled to the first switch circuit and the second switch circuit, wherein the controller is configured to:

in a first mode, cause the first switch circuit to couple the first input of the first switch circuit to the output of the first switch circuit, and cause the second switch circuit to couple the second input of the second switch circuit to the output of the second switch circuit; and in a second mode, cause the first switch circuit to couple the second input of the first switch circuit to the output of the first switch circuit, and cause the second switch circuit to couple the first input of the second switch circuit to the output of the second switch circuit.

14. The receiver of claim 10, wherein the first switch circuit comprises a first attenuator, and the second switch circuit comprises a second attenuator.

15. The receiver of claim 10, further comprising an attenuator, wherein the attenuator is coupled between the output of the first common-source amplifier and the first input of the first switch circuit, and the attenuator is coupled between the output of the first common-source amplifier and the first input of the second switch circuit.

16. The receiver of claim 15, wherein the attenuator comprises a variable resistor.

17. The receiver of claim 10, wherein:
the first common-source amplifier comprises:
  a first transistor having a source, a gate, and a drain, wherein the gate of the first transistor is coupled to the input of the first common-source amplifier, and the drain of the first transistor is coupled to the output of the first common-source amplifier; and
  a source-degeneration inductor coupled between the source of the first transistor and a ground; and
the first common-gate amplifier comprises:
  a second transistor having a source, a gate, and a drain, wherein the source of the second transistor is coupled to the input of the first common-gate amplifier, and the gate of the second transistor is coupled to a bias circuit; and
  a load coupled to the drain of the second transistor.

18. The receiver of claim 17, wherein the load comprises a load inductor, and the output of the first common-gate amplifier is coupled to the load inductor.

19. The receiver of claim 10, wherein the amplifier circuit further comprises:
a second common-source amplifier having an input and an output, wherein the input of the second common-source amplifier is coupled to the input of the first common-source amplifier; and
a second common-gate amplifier having an input and an output, wherein the input of the second common-gate amplifier is coupled to the output of the second common-source amplifier, and the output of the second common-gate amplifier is coupled to the output of the first common-gate amplifier.

20. A method for wireless communications, comprising:
receiving multiple signals via an antenna;
passing the multiple signals through a first gain path, the first gain path including a common-source amplifier and a common-gate amplifier;
passing the multiple signals through a second gain path, the second gain path including the common-source amplifier and excluding the common-gate amplifier;
in a first mode, routing the multiple signals passing through the first gain path to a first receive chain and routing the multiple signals passing through the second gain path to a second receive chain;
in a second mode, routing the multiple signals passing through the first gain path to the second receive chain and routing the multiple signals passing through the second gain path to the first receive chain;
in a third mode, splitting the multiple signals passing through the first gain path into a first split signal and a second split signal;
attenuating the first split signal by a first attenuation; and
attenuating the second split signal by a second attenuation, wherein the second attenuation is different from the first attenuation.

21. The method of claim 20, wherein the second gain path includes an attenuator.

22. The method of claim 21, wherein the first gain path excludes the attenuator.

23. The method of claim 20, further comprising:
mixing the multiple signals passing through the first gain path with a first oscillator signal; and
mixing the multiple signals passing through the second gain path with a second oscillator signal, wherein the first oscillator signal and the second oscillator signal have different frequencies.

24. A receiver, comprising:
an amplifier circuit, wherein the amplifier circuit includes:
  a first transistor having a source, a gate, and a drain;
  a second transistor having a source, a gate, and a drain, wherein the source of the second transistor is coupled to the drain of the first transistor, and the gate of the second transistor is coupled to a bias circuit;
  a third transistor having a source, a gate, and a drain;
  a fourth transistor having a source, a gate, and a drain, wherein the source of the fourth transistor is coupled to the drain of the third transistor, and the gate of the fourth transistor is coupled to the bias circuit;
  a load coupled to the drain of the second transistor and the drain of the fourth transistor;
  wherein an input of the amplifier circuit is coupled to the gate of the first transistor and the gate of the third transistor, a first output of the amplifier circuit is coupled to the load, and a second output of the amplifier circuit is coupled between the drain of the first transistor and the source of the second transistor;
a first switch circuit having a first input, a second input, and an output, wherein the first input of the first switch circuit is coupled to the first output of the amplifier circuit, and the second input of the first switch circuit is coupled to the second output of the amplifier circuit; and
a second switch circuit having a first input, a second input, and an output, wherein the first input of the second switch circuit is coupled to the first output of the amplifier circuit, and the second input of the second switch circuit is coupled to the second output of the amplifier circuit; and
a splitter having an input, a first output, and a second output, wherein the input of the splitter is coupled to the load, the first output of the splitter is coupled to a third input of the first switch circuit, and the second output of the splitter is coupled to a third input of the second switch circuit.

25. The receiver of claim 24, further comprising a controller coupled to the first switch circuit and the second switch circuit, wherein the controller is configured to:
in a first mode, cause the first switch circuit to couple the first input of the first switch circuit to the output of the first switch circuit, and cause the second switch circuit to couple the second input of the second switch circuit to the output of the second switch circuit; and
in a second mode, cause the first switch circuit to couple the second input of the first switch circuit to the output of the first switch circuit, and cause the second switch circuit to couple the first input of the second switch circuit to the output of the second switch circuit.

* * * * *